United States Patent [19]
Suwa et al.

[11] Patent Number: 5,204,837
[45] Date of Patent: Apr. 20, 1993

[54] SEMICONDUCTOR MEMORY DEVICE HAVING TEST MODE

[75] Inventors: Makoto Suwa; Hiroshi Miyamoto, both of Hyogo, Japan

[73] Assignee: Mitsubishi Denki Kabushiki Kaisha, Tokyo, Japan

[21] Appl. No.: 744,750

[22] Filed: Aug. 14, 1991

[30] Foreign Application Priority Data

Aug. 16, 1990 [JP] Japan .................. 2-216550

[51] Int. Cl.$^5$ .......................................... G11C 29/00
[52] U.S. Cl. .................. 365/201; 365/189.05; 365/193
[58] Field of Search ............ 365/201, 189.05, 193, 365/63, 200, 226, 154; 357/71; 371/21.2; 395/575

[56] References Cited

U.S. PATENT DOCUMENTS

| 4,933,902 | 6/1990 | Yamada et al. | 365/193 |
| 5,016,220 | 5/1991 | Yamagata | 365/201 |
| 5,051,995 | 9/1991 | Tobita | 365/201 |
| 5,073,874 | 12/1991 | Yamada et al. | 365/193 |
| 5,088,063 | 2/1992 | Matsuda et al. | 365/201 |
| 5,132,937 | 7/1992 | Tuda et al. | 365/201 |
| 5,157,630 | 10/1992 | Suwa et al. | 365/201 |

FOREIGN PATENT DOCUMENTS

| 4041408A1 | 7/1991 | Fed. Rep. of Germany | 365/201 |
| 62-250593 | 10/1987 | Japan | 365/201 |

Primary Examiner—Eugene R. LaRoche
Assistant Examiner—Andrew Tran
Attorney, Agent, or Firm—Lowe, Price, LeBlanc & Becker

[57] ABSTRACT

A DRAM includes a test mode controller generating a test mode designating signal designating a test mode at a fall of an external control signal $\overline{RAS}$ when the logical levels of external control signals $\overline{CAS}$ and $\overline{WE}$ are low, and a power-on reset circuit responsive to a power supply for generating a reset pulse for resetting main circuits for data reading and data writing. Each of the external control signals $\overline{CAS}$ and $\overline{WE}$ are supplied to the test mode controller and the main circuits through a buffer circuit. A first buffer circuit for supplying the external control signal $\overline{RAS}$ to the test mode controller is provided separately from a second buffer circuit for supplying the external control signal $\overline{RAS}$ to the main circuits. The second buffer circuit receives the output of the power-on reset circuit and the external control signal $\overline{RAS}$ to buffer the control signal $\overline{RAS}$ only when no reset pulse is generated. The first buffer circuit receives only the external control signal $\overline{RAS}$ to continuously buffer the same without being affected by a reset pulse.

43 Claims, 13 Drawing Sheets

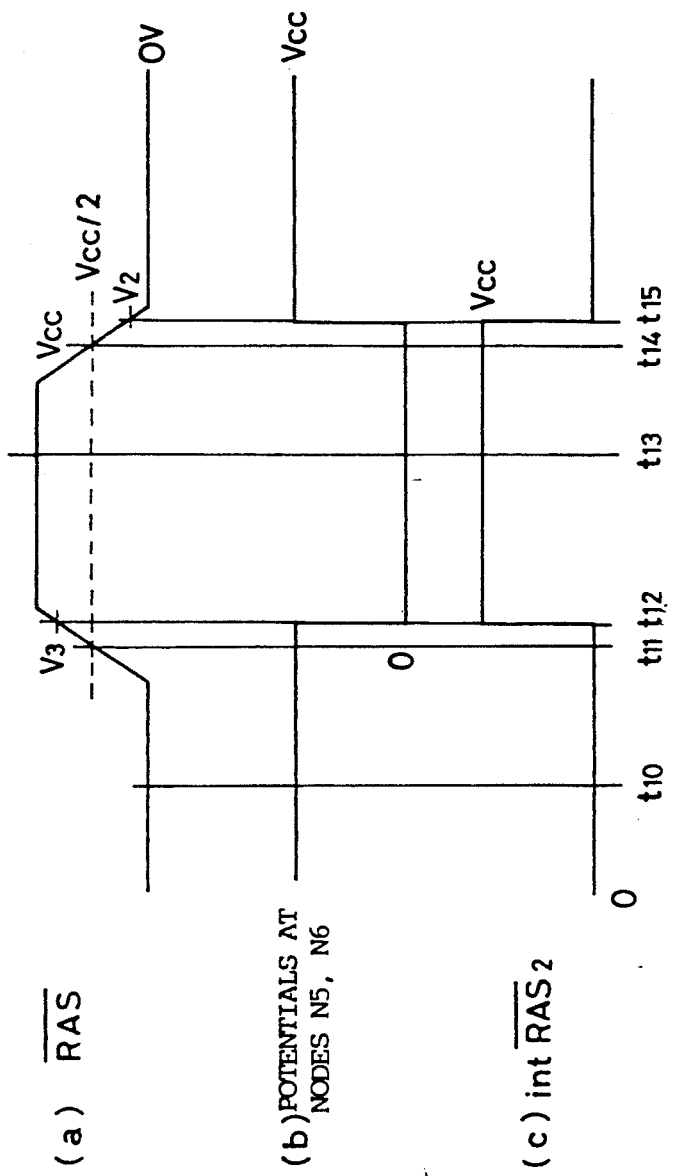

STATE AT t10

STATE AT t11

STATE AT t13

STATE AT t14

SEMICONDUCTOR MEMORY DEVICE HAVING TEST MODE

BACKGROUND OF THE INVENTION

1. Field of the Invention

The present invention relates generally to semiconductor memory devices, and more particularly, to semiconductor memory devices having a test mode set in response to external control signals.

2. Description of the Background Art

With the recent increase in capacity of a semiconductor memory device, a function test of a memory cell array of a manufactured semiconductor memory device has been acquiring more importance. However, a time period required for such a function test has disadvantageously increased with an increase in the number of memory cells included in a memory cell array. Therefore, in order to reduce a time period required for such a function test of a semiconductor memory device, a so called on-chip test circuit system is recently adopted, on which system has been circuitry (referred to as a test circuit hereinafter) for such a function test is provided on the same chip as circuits constituting the semiconductor memory device are provided. Such an on-chip test circuit system is often employed for many DRAMs (Dynamic Random Access Memory), for example.

FIG. 13 is a block diagram showing an entire arrangement of a DRAM under the on-chip test circuit system. With reference to FIG. 13, a memory cell array 1 comprises memory cells (not shown) arranged in a matrix of rows and columns, word lines (not shown) each provided for each row, and bit line pairs (not shown) each pair provided for each column. Each memory cell is connected to a word line in the corresponding row and a bit line pair in the corresponding column. A row decoder 2 selects a word line and a column decoder 3 selects a bit line pair in response to row address signals RA0–RA9 and column address signals CA0–CA9 output from an address buffer 4, respectively.

Address buffer 4 receives either internal address signals Q0–Q9 output from a refresh counter 8 or external address signals A0–A10 in response to an internal row address strobe signal intRAS output from a RAS input circuit 10 and an internal column address strobe signal intCAS output from a CAS input circuit 12. Address buffer 4 outputs row address signals RA0–RA10 and column address signals CA0–CA10 in response to the received address signal. Address buffer 4 receives external address signals A0–A10 at the time of ordinary data reading and writing. Address buffer 4 receives internal address signals Q0–Q9 from refresh counter 8 at the time of refreshing, that is, rewriting data in a memory cell before storage data of the memory cell in memory cell array 1 is lost.

In response to an internal row address strobe signal intRAS from RAS input circuit 10, a refresh controller 9 controls refresh counter 8 to output an internal address signal in a fixed timing. In response to an output from refresh controller 9, refresh counter 8 generates internal address signals Q0–Q9 indicative of an address of a memory cell which storage data is to be refreshed.

Row decoder 2 selects a word line in response to row address signals RA0–RA9 from address buffer 4 in a timing of the internal row address strobe signal intRAS from RAS input circuit 10. Column decoder 3 selects a bit line pair in response to column address signals CA0–CA9 from address buffer 4 in a timing of the internal address strobe signal intCAS from CAS input circuit 12. More specifically, column decoder 3 controls an I/O gate 5 so as to electrically connect with an input buffer 6 or an output buffer 7, only a bit line pair corresponding to column address signals CA0–CA9 out of the bit line pairs in memory cell array 1.

I/O gate 5 includes transfer gates (not shown) each provided corresponding to each bit line pair in order to connect the corresponding bit line pair in memory cell array 1 with input buffer 6 and output buffer 7. Column decoder 3 selects a bit line pair by turning on, out of the transfer gates included in the I/O gate, only a transfer gate corresponding to a bit line pair at the column address designated by column address signal CA0–CA9.

A sense amplifier 15 amplifies data (read data) read out onto each bit line pair of memory cell array 1 in data reading. The bit line selecting operation of column decoder 3 allows the only bit line pair corresponding to the address signals, out of the bit line pairs in memory cell array 1, to be connected to output buffer 7 through I/O gate 5. Therefore, only the data read out onto the corresponding bit line pair out of the bit line pairs in memory cell array 1 is amplified by sense amplifier 15 and then, applied to a data output terminal Dout through output buffer 7.

In data writing, the data externally applied to a data input terminal Din is applied to I/O gate 5 through input buffer 6. Then, the externally applied data is written in a memory cell through a bit line pair selected by column decoder 3 out of the bit line pairs in memory array 1.

Data is transferred between I/O gate 5 and input buffer 6 or output buffer 7 on a maximum of 8-bit basis. In ordinary data writing and reading, however, an I/O controller 11 controls input buffer 6 and output buffer 7 to enable data transfer between I/O gate 5 and input buffer 6 or output buffer 7 on a four-bit basis. I/O controller 11 controls input buffer 6 and output buffer 7 in response to the most significant bit signals RA10 and CA10 of the row address signals RA0–RA10 and the column address signals CA0–CA10, respectively, output from address buffer 4, and to an internal write enable signal intWE output from a WE input circuit 13. More specifically, I/O controller 11 controls operation of output buffer 7 in response to row address signal RA10 and column address signal CA10 so as to output only the one bit data corresponding to the address designated by row address signal RA10 and column address signal CA10 out of the 4-bit data received by output buffer 7 from I/O gate 5, in the data reading where internal write enable signal intWE is at a "H" (logical high) level. Similarly, in data writing where internal write enable signal intWE is at a "L" (logical low) level, I/O controller 11 controls operation of input buffer 6 in response to row address signal RA10 and column address signal CA10 so as to receive data applied from data input terminal Din and apply the same to a transfer gate, out of the transfer gates in I/O gate 5, corresponding to a bit line pair at the address designated by row address signal RA10 and column address signal CA10. At the time of refreshing, the data read by output buffer 7 is again applied to I/O gate 5 as write data. In the refreshing, address buffer 4 receives internal address signals Q0–Q9 from refresh counter 8, for the storage of data of a memory cell at the address designated by internal address signals Q0–Q9.

In a test mode for a function test of the memory cells in memory cell array 1, data is transferred between I/O gate 5 and input buffer 6 or output buffer 7 on a 8-bit basis. In other words, column decoder 3, input buffer 6 and output buffer 7 operate in response to a test enable signal $\overline{TE}$ of "L" level from a test mode controller 14 in the test mode. More specifically, column decoder 3 selects a bit line pair by decoding only less significant bits column address signals CA0-CA9 while ignoring the most significant bit column address signal CA10 when receiving "L" level test enable signal $\overline{TE}$ from test mode controller 14. As a result, the number of bit line pairs selected each time by column decoder 3 is double the number in ordinary data reading and writing in number. Input buffer 6 is controlled by I/O controller 11 to apply 8-bit data applied to data input terminal Din in parallel to I/O gate 5 while receiving the "L" test enable signal $\overline{TE}$ from test mode controller 14. Similarly, output buffer 7 is controlled by I/O controller 11 to apply, to data output terminal Dout, the 8-bit data supplied in parallel from I/O gate 5 while receiving the "L" level test enable signal $\overline{TE}$ from test mode controller 14. Therefore, in a test mode, the data read out onto eight pairs of bit lines selected by column decoder 3 is externally output through output buffer 7, while externally applied 8-bit write data is applied in parallel to said eight pairs of bit lines through input buffer 6. A function test of a memory cell array is executed by verifying an agreement of predetermined write data to all or some of memory cells included in the memory cell array with read data therefrom. Therefore, the above-described operations of column decoder 3, input buffer 6 and output buffer 7 in a test mode automatically enables simultaneous tests for eight memory cells. In other words, memory cells in memory cell array 1 are automatically tested eight at a time in a test mode. A pattern of data to be written in a memory cell array for a test or the like varies depending on the type of the test.

Test mode controller 14 is a circuit for setting the DRAM to operate in a test mode or returning the operation mode of the DRAM from the test mode to a normal mode in response to the internal row address strobe signal int$\overline{RAS}$ from $\overline{RAS}$ input circuit 10, the internal column address strobe signal int$\overline{CAS}$ from $\overline{CAS}$ input circuit 12 and the internal write enable signal int$\overline{WE}$ from $\overline{WE}$ input circuit 13.

Specific operation of test mode controller 14 will be described with reference to FIGS. 14 and 15. FIG. 14 is a waveform diagram showing internal row address strobe signal int$\overline{RAS}$, internal column address strobe signal int$\overline{CAS}$ and internal write enable signal int$\overline{WE}$ in a case where test mode controller 14 sets the DRAM to operate in a test mode. FIG. 15 is a waveform diagram showing the same signals in a case where test mode controller 14 returns the operation mode of the DRAM from the test mode to a normal mode.

With reference to FIG. 14, test mode controller 14 is activated when both internal signal int$\overline{CAS}$ (FIG. 14(b)) and int$\overline{WE}$ (FIG. 14(c)) are at a "L" level at time t1 when internal signal int$\overline{RAS}$ (FIG. 14(a)) falls. The activated test mode controller 14 drops the test enable signal $\overline{TE}$ (FIG. 14(d)) to a "L" level. Consequently, column decoder 3, input buffer 6 and output buffer 7 of FIG. 13 operate for the above-described test.

Conversely, with reference to FIG. 15, test mode controller 14 is inactivated in response to the internal signal int$\overline{CAS}$ (FIG. 15(b)) attaining a "L" level and the internal signal int$\overline{WE}$ (FIG. 15(c)) attaining a "H" level at time t2 when the internal signal int$\overline{RAS}$ (FIG. 15(a)) falls. The inactivated test mode controller 14 brings the test enable signal $\overline{TE}$ (FIG. 15(d)) to a "H" level. As a result, column decoder 3, input buffer 6 and output buffer 7 of FIG. 13 do not receive the "L" level test enable signal $\overline{TE}$, thereby operating as described above for ordinary data reading and writing.

$\overline{RAS}$ input circuit 10, $\overline{CAS}$ input circuit 12 and $\overline{WE}$ input circuit 13 buffer an external row address strobe signal $\overline{RAS}$, an external column address strobe signal $\overline{CAS}$ and an external write enable signal $\overline{WE}$ as external control signals, respectively, and outputs the same as the internal row address strobe signal int$\overline{RAS}$, the internal column address strobe signal int$\overline{CAS}$ and the internal write enable signal int$\overline{WE}$. The internal signals int$\overline{RAS}$, int$\overline{CAS}$ and int$\overline{WE}$ take approximately the same waveforms as those of the external control signals $\overline{RAS}$, $\overline{CAS}$ and $\overline{WE}$. Since test mode controller 14 operates as described in the foregoing, in order to set the DRAM to operate in a test mode, the external control signal $\overline{RAS}$ should be dropped to a "L" level while both of the external control signal $\overline{CAS}$ and $\overline{WE}$ are at a "L" level. Conversely, in order to release the DRAM from the test mode, the external control signal $\overline{RAS}$ should be dropped to a "L" level while the external control signal $\overline{CAS}$ is at a "L" level and the external control signal $\overline{WE}$ is at a "H" level.

The timing of the control signal for dropping row address strobe signal $\overline{RAS}$ after a fall of column address strobe signal $\overline{CAS}$ as shown in FIGS. 14 and 15 is also employed in refreshing.

Again with reference to FIG. 13, a power-on reset circuit 18 is supplied with a voltage Vcc from an external power source (not shown) Power-on reset circuit 18 applies a "H" level one-shot pulse to predetermined circuits in the DRAM in response to a rise of the power supply voltage Vcc, that is, to a power supply to the DRAM. This one-shot pulse is referred to as a power-on reset signal POR. The power-on reset signal POR forces a potential at a predetermined node in the predetermined circuits to a level to be attained in an initialized state. As a result, the predetermined circuit portion is reset before starting its operation. Power-on reset signal POR is also applied to $\overline{RAS}$ input circuit 10, for example.

Although output POR of power-on reset circuit 18 is applied only to $\overline{RAS}$ input circuit 10 in FIG. 13, the output POR can be applied to other circuits as required in practice.

FIG. 16 is a circuit diagram showing the internal arrangement of $\overline{RAS}$ input circuit 10. With reference to FIG. 16, $\overline{RAS}$ input circuit 10 is a buffer circuit including an inverter 20 receiving external row address signal $\overline{RAS}$ as an input and an inverter 21 receiving the output of inverter 20 as an input. Inverter 20 includes a P channel MOS transistor Q1 and an N channel MOS transistor Q2 each receiving external row address strobe signal $\overline{RAS}$ at its gate, and a P channel MOS transistor Q3 and an N channel MOS transistor Q4 each receiving power-on reset signal POR at its gate. Transistors Q1 and Q2 are connected in series between power supply Vcc and ground GND. Transistor Q3 is provided between transistor Q1 and power supply Vcc. Transistor Q4 is connected in parallel to transistor Q2. The output end of inverter 20 is a node n2 between transistors Q1 and Q2. Inverter 21 includes a P channel MOS transistor Q5 and an N channel MOS transistor Q6 each receiving a potential at node N2 at its gate. Transistors Q5 and Q6 are connected in series between power supply Vcc and ground GND. The output end of inverter 21 is a node N4 between transistors Q5 and Q6. The potential at the node N4 is applied as an internal row address strobe signal intRAS to a predetermined circuit portion.

A "H" level potential of output end N2 of inverter 20 turns on transistor Q6 of inverter 21, whereby the potential at node N4 attains a "L" level. Conversely, a "L" level potential at node N2 turns on transistor Q5 of inverter 21, whereby the potential at node N4 attains a "H" level.

When transfer gate Q3 is ON and transistor Q4 is OFF in inverter 20, the source of transistor Q1 is electrically connected to power supply Vcc and transistor Q4 exercises no effect on the potential at node N2. Therefore, in this case, the arrangement of inverter 20 is the same as that of inverter 21 in operation. In other words, the potential level of the external row address strobe signal RAS applied to input end N1 of inverter 20 is inverted by the switching operation of transistors Q1 and Q2, the inverted potential appears at output end N2 of inverter 20. Therefore, the internal row address strobe signal intRAS takes the same waveform as that of the external row address strobe signal RAS when output POR of power-on reset circuit 18 of FIG. 13 is at a "L" level, that is, when no power-on reset signal is applied to RAS input circuit 10. However, if transistor Q3 is OFF and transistor Q4 is ON in inverter 20, the potential at node N2 attains a "L" level in response to a low potential of ground GND applied through transistor Q4, irrespective of conduction states of transistors Q1 and Q2. In this case, therefore, the potential at output end N4 of RAS input circuit 10 attains a "H" level, irrespective of the potential level of the external row address strobe signal RAS. In other words, the internal row address strobe signal intRAS attains a "H" level when RAS input circuit 10 receives a power-on reset signal, irrespective of the potential level of the external row address strobe signal RAS. That is, while RAS input circuit 10 receives a power-on reset signal, inverter 20 is inactivated to inactivate a buffering operation of RAS input circuit 10.

RAS input circuit 10 is structured as describe to be activated/inactivated in response to output POR of power-on reset circuit 18. The internal row address strobe signal intRAS is therefore once forced to a predetermined level "H", after a power supply, in response to the output of the "H" power-on reset signal from power-on reset circuit 18 at the power supply. Thereafter, the potential of the internal row address strobe signal intRAS changes following the potential change of the external row address strobe signal RAS to enable a predetermined circuit portion to be controlled in response to the external address strobe signal RAS. This is for forcing such circuit portions to be controlled in response to an external row address strobe signal RAS as row decoder 2, address buffer 4 and refresh controller 9 to enter an initialized state. In other words, the internal row address strobe signal intRAS attaining a "H" level at a power supply forces a node receiving an internal row address strobe signal intRAS in each circuit portion to have a potential allowing the circuit portion to be initialized.

As described in the foregoing, in a conventional DRAM including a test circuit on the same chip, a circuit portion (test mode controller 14 of FIG. 13) designating a test mode operates in response to internal signals intRAS, intCAS and intWE obtained by buffering external signals RAS, CAS and WE. However, the circuit portion designating a test mode might malfunction at the power supply because of the arrangement of the circuit portion (RAS input circuit 10 of FIG. 13) buffering an external signal RAS (see FIG. 17). This phenomenon will be more specifically described in the following with reference to FIGS. 17 through 14. FIGS. 17 through 14 are waveform diagrams explaining why such a phenomenon is caused.

With reference to FIG. 13, the conventional RAS input circuit 10 is controlled by output POR of power-on reset circuit 18. Therefore, a rise of power supply voltage Vcc (FIG. 17(a)) upon a power supply is followed by output POR (FIG. 17(b)) of power-on reset circuit 18 attaining a "H" level for a fixed time period, with reference to FIG. 17. While output POR of power-on reset circuit 18 is at a "H" level, that is, while RAS input circuit 10 receives a power-on reset signal, output intRAS (FIG. 17(d)) of RAS input circuit 10 attains a "H" level, irrespective of the external row address strobe signal RAS (FIG. 17(c)).

All of the three external control signals RAS, CAS and WE controlling test mode controller 14 are brought to a "H" level after a predetermined circuit portion is initialized in response to a power-on reset signal after a power supply. More specifically, the low active external control signals RAS, CAS and WE are brought to a "L" level or to a "H" level in a predetermined timing after once brought to a "H" level, thereby to control the predetermined circuit portion. Therefore, as shown in FIGS. 17(c), 17(e) and 17(f), respectively, the external control signals RAS, CAS and WE are at a "L" level in all the periods including a period when output POR of power-on reset circuit 18 is at a "H" level. On the other hand, CAS input circuit 12 and WE input circuit 13, without receiving a power-on reset signal, buffers the external control signals CAS and WE and outputs the same after a power supply. As a result, the internal column address strobe signal intCAS and the internal write enable signal intWE take approximately the same waveforms as those of the external signals CAS and WE, irrespective of the potential level of output POR of power-on reset circuit 18. Both of the internal column address strobe signal intCAS and the internal write enable signal intWE are, therefore, at a "L" level at t3 when the internal row address strobe signal intRAS falls. As described above, test controller 14 outputs a "L" level test enable signal TE designating a test mode in response to the internal signal intRAS falling to a "L" when both of the internal signals intCAS and intWE are at a "L" level. In this way, the DRAM of FIG. 13 is set to operate in a test mode in response to a fall of the internal signal intRAS in response to a fall of the output POR of power-on reset circuit 18. In other words, a conventional DRAM is set to operate in a test mode before receiving external control signals RAS, CAS and WE for enabling circuit operations for data reading and writing. Once the DRAM enters a test mode, it does not return to a normal mode unless the internal signal RAS falls to bring output TE of test mode controller 14 to a "H" level when internal signal CAS is at a "L" and the internal signal WE is at a "H" level. Therefore, even when ordinary data reading and writing should be performed by dropping one of the external signals RAS, CAS and WE in a predetermined timing after a power supply, the DRAM set to operate in a test mode does not accurately accept applied external address signals and the data to be written, etc. but it malfunctions.

In order to avoid such a problem, conventionally, the external signal $\overline{RAS}$ should be dropped once in a period when trial external signals $\overline{RAS}$, $\overline{CAS}$ and $\overline{WE}$ are applied to the DRAM prior to the application of the external signals $\overline{RAS}$, $\overline{CAS}$ and $\overline{WE}$ for ordinary data reading and writing, that is, in a dummy cycle. In other words, by setting a time point at which the internal signal int$\overline{RAS}$ falls when the internal signals int$\overline{CAS}$ and int$\overline{WE}$ are at a "L" level and a "H" level, respectively, the DRAM at an initialized state is reliably set to operate in a normal mode.

The DRAM might automatically enter the test mode by accident after a power supply not only at a fall of the power-on reset signal as described above but also at a first rise of the external row address strobe signal $\overline{RAS}$ after the power supply.

It is assumed, for example, that a first rise time of the external row address strobe signal $\overline{RAS}$ is long after a power supply because of the large total load to be driven by the external row address strobe signal $\overline{RAS}$ or the like. With reference to FIG. 18, when external row address strobe signal $\overline{RAS}$ rises slowly as shown in FIG. 18(b) after a rise of a power supply voltage to Vcc (FIG. 18(a)) upon a power supply, output int$\overline{RAS}$ of $\overline{RAS}$ input circuit 10 of FIG. 13 rises with a delay time of T after external row address strobe signal $\overline{RAS}$ starts rising as shown in FIG. 18(b). External row address strobe signal $\overline{RAS}$ rises after one-shot pulse is output from power-on reset circuit 18, which is supposed to be followed by a potential rise of output signal int$\overline{RAS}$ from $\overline{RAS}$ input circuit 10. As shown in FIG. 16, however, $\overline{RAS}$ input circuit 10 includes inverter 20 inverting external row address strobe signal $\overline{RAS}$. With reference to FIG. 16, the potential at node N2 therefore should attain a logical level opposite to that of the potential of external row address strobe signal $\overline{RAS}$ to allow the potential of internal row address strobe signal int$\overline{RAS}$ obtained at node N4 to have the same logical level as that of the potential of external row address strobe signal $\overline{RAS}$ applied to node N1. That is, the potential of external row address strobe signal $\overline{RAS}$ should exceed a threshold voltage V1 of the inverter 20. A threshold voltage of a CMOS inverter is ordinarily set to an intermediate value between a potential of a low potential source and a potential of a high potential source connected thereto. Threshold voltage V1 of inverter 20 has an approximately intermediate value (Vcc/2) between the potentials of power supply voltage Vcc ("H" level) and ground GND ("L" level).

With reference to FIG. 18 in addition to FIG. 16, the external signal $\overline{RAS}$ rising slowly results in an increase in a time period required for the potential at node N1 to exceed threshold voltage V1 of inverter 20 in FIG. 16. Therefore, internal row address strobe signal int$\overline{RAS}$ is late in rising than external row address strobe signal $\overline{RAS}$, by a time period required for the potential of external row address strobe signal $\overline{RAS}$ to change from a ground potential to threshold voltage V1 of inverter 20.

As described above, the logical level of the potential of output signal int$\overline{RAS}$ from $\overline{RAS}$ input circuit 10 is low only when the potential of external signal $\overline{RAS}$ is equal to or less than threshold voltage V1 of inverter 20. As a result, the following problem arises when external signal $\overline{RAS}$ rises slowly and includes noise at around threshold voltage V1 of inverter 20 after a power supply as shown in FIG. 19(b).

The potential of external signal $\overline{RAS}$ may become higher than threshold voltage V1 of inverter 20 and then, become lower than the same before completely rising to a "H" level (see FIG. 19(b)). In such a case, the inverter 20 takes external signal $\overline{RAS}$ equal to or above said threshold voltage V1 for "H" level and the signal RAS lower than threshold voltage V1 for "L" level in $\overline{RAS}$ input circuit 10. As shown in FIG. 19(c), the potential of internal signal int$\overline{RAS}$ therefore attains a "H" level in the period T1 when the potential of external signal RAS exceeds said threshold voltage V1 and drops to a "L" level when the same becomes said threshold voltage V1 or lower thereafter. Then, internal signal int$\overline{RAS}$ again attains a "H" level when external signal $\overline{RAS}$ attains a level equal to or above said threshold voltage V1 thereafter in spite of fluctuation due to noise. As described in the foregoing, noise included in external signal $\overline{RAS}$ at around the threshold V1 causes internal signal int$\overline{RAS}$ to have false leading edge and trailing edge.

On the other hand, with an external signal rising slowly, when external row address strobe signal $\overline{RAS}$ rises prior to external column address strobe signal $\overline{CAS}$ and external write enable signal $\overline{WE}$ after a rise of power supply voltage Vcc (FIG. 19(a)) upon a power supply, it is possible that both of the internal column address strobe signal int$\overline{CAS}$ (FIG. 19(d)) and internal write enable signal int$\overline{WE}$ (FIG. 19(e)) attain a "L" level in a period when external row address strobe signal $\overline{RAS}$ is not completely brought to a "H" level. In such a case, both of the internal column address strobe signal int$\overline{CAS}$ and infernal write enable signal int$\overline{WE}$ are at a "L" level at time t4 at which internal row address strobe signal int$\overline{RAS}$ falls due to the noise. Therefore, test mode controller 14 of FIG. 13 outputs a "L" level test enable signal $\overline{TE}$ in response to the fall of internal signal $\overline{RAS}$ due to the noise. As a result, the DRAM of FIG. 13 enters the test mode before external signals $\overline{RAS}$, $\overline{CAS}$ and $\overline{WE}$ are once brought to a "H" level for operating the DRAM in practice.

A period is not shown in FIGS. 18 and 19 when internal signal $\overline{RAS}$ attains a "H" level in response to a power-on reset signal immediately after a power supply.

As such a buffer circuit for buffering external signals as input circuits 10, 12 and 13 of FIG. 13, a circuit may be used wherein an input potential corresponding to a switching point of an output potential from a "H" level to a "L" level is set slightly lower than the threshold voltage (Vcc/2) of a CMOS inverter and an input potential corresponding to a switching point of the output potential from a "L" to "H" is set to the threshold voltage (Vcc/2) of the CMOS inverter. Referring to FIG. 6, such circuit can be implemented by adding a small-sized P channel MOS transistor connected between the input end of inverter 21 and power supply Vcc and having a gate receiving the output potential of inverter 21.

In the following description, a buffer circuit will be also referred to as a hysteresis buffer, which has different input potentials; one of which corresponds to a switching point of an output potential from a "H" level to "L" level and the other corresponds to a switching point of the same from a "L" level to a "H" level. As described above, as the conventional input circuits 10, 12 and 13, a buffer circuit is commonly used in which a difference between these two input potentials (threshold voltage) is small, that is, a hysteresis buffer is used in which a difference between hysteresis of an output potential with an input potential being increased and hysteresis of an output potential with the input potential being reduced is small.

Resetting of row decoder 2, address buffer 4, refresh controller 9 and the like by the output of power-on reset circuit 18 can be implemented by inputting the output POR of power-on reset circuit 18 not to $\overline{RAS}$ input circuit 10 but to a circuit arranged in the succeeding stage to $\overline{RAS}$ input circuit, that is, to a circuit which is located in the preceding stage to circuits to be reset (row decoder 2, address buffer 4, refresh controller 9 and the like) and is located more closer to these. In such a case, $\overline{RAS}$ input circuit 10 does not exhibit such problem as described above caused by the output POR of power-on reset circuit 18. However, the above-described hysteresis buffer used as $\overline{RAS}$ input circuit 10 causes the following problems.

That is, the level of internal row address strobe signal int$\overline{RAS}$ changes from "H" to "L" only when the potential of external row address strobe signal $\overline{RAS}$ becomes lower than a conventional threshold voltage (Vcc/2). Hence, the operation margin of $\overline{RAS}$ input circuit 10 for input signal $\overline{RAS}$ is reduced.

Furthermore, a potential on an internal row address strobe signal int$\overline{RAS}$ later in changing than an external row address strobe signal $\overline{RAS}$ results in delay in a start of operations for data writing and data reading by such circuits as row decoder 2, address buffer 4 and refresh controller 9 which are to be controlled by the external row address strobe signal $\overline{RAS}$. Therefore, the use of a hysteresis buffer as $\overline{RAS}$ input circuit 10 increases an access time of the semiconductor memory device.

SUMMARY OF THE INVENTION

An object of the present invention is to provide a semiconductor memory device reliably entering a test mode in response to only an external control signal.

Another object of the present invention is to provide a semiconductor memory device including a circuit for designating a test mode which does not malfunction due to potential fluctuation of an external control signal caused by noise.

A further object of the present invention is to provide a semiconductor memory device which does not malfunction to enter a test mode even though a test mode is not designated by an external control signal after a power is supplied.

A still further object of the present invention is to provide a semiconductor memory device including a circuit for designating a test mode which is not affected by a power-on reset signal.

A still further object of the present invention is to provide a semiconductor memory device reliably set to operate in a test mode without being affected by noise included in an external control signal and a power-on reset signal.

A still further object of the present invention is to provide a semiconductor memory device reliably set to operate in a test mode without increasing an access time in ordinary data reading and data writing.

The semiconductor memory device according to the present invention includes a memory cell array, internal circuits related to data reading from the memory cell array and data writing to the same, a test mode designating signal generating circuit for designating a test mode in response to a potential level of a third external control signal changing from a first logical level to a second logical level when both potentials of first and second external control signals are at the first logical level, and reset pulse generating circuit responsive to a power supply for generating a reset pulse for initializing the internal circuit. The internal circuit operates in response to the first, the second and the third external control signals after a reset pulse is output from the reset pulse generating circuit.

In order to achieve the above-described objects, the semiconductor memory device according to the present invention includes a first buffer for buffering the third external control signal and applying the same to the internal circuit only when the reset pulse generating circuit generates no reset pulse, and a second buffer for buffering the third external control signal at all times and applying the same to the test mode designating signal generating circuit.

As described above, the semiconductor memory device according to the present invention is provided with separate buffers for supplying a third external control signal to the test mode designating signal generating circuit and for supplying a third external control signal to the other internal circuits. Then, similarly to conventional one, the first buffer supplying a third external control signal to the internal circuit applies the third external control signal to the internal circuit only when the reset pulse generating circuit generates no reset pulse. Therefore, like the conventional one, the internal circuit operates in response to the first, the second and the third external control signals after being initialized in response to a reset pulse upon a power supply. On the other hand, the second buffer supplying a third external control signal to the test mode designating signal generating circuit buffers the third external control signal at all times and applies the same to the test mode designating signal generating circuit. Therefore, differently from the conventional one, the test mode designating signal generating circuit receives the third external control signal having a waveform unrelated to the reset pulse generated in response to the power supply, thereby operating without being affected by the reset pulse.

In accordance with a preferred embodiment, the second buffer includes a first inverter for inverting the third external control signal and a second inverter for inverting the output of the first inverter. For example, the first inverter includes a first P channel MOS transistor and a first N channel MOS transistor connected in series between a high potential source and a low potential source and rendered conductive or non-conductive in response to the third control signal and the second inverter includes a second P channel MOS transistor and a second N channel MOS transistor connected in series between the high potential source and the low potential source and rendered conductive or non-conductive in response to a potential at a node between the first P channel MOS transistor and the first N channel MOS transistor.

The first buffer includes a third inverter inverting a third external control signal, a fourth inverter inverting the output of the third inverter and a forcing circuit for temporarily forcing the output of the third inverter to a predetermined potential in response to a reset pulse. For example, the third inverter includes a third P channel MOS transistor and a third N channel MOS transistor connected in series between the high potential source and the low potential source and rendered conductive or non-conductive in response to the third external control signal, and the fourth inverter includes a fourth P channel MOS transistor and a fourth N channel MOS transistor connected in series between the high potential source and the low potential source and rendered conductive or non-conductive in response to a potential at a node between the third P channel MOS transistor and the third N channel MOS transistor. Both of the third and the fourth P channel MOS transistors are connected to the high potential source and both of the third and the fourth N channel MOS transistors are connected to the low potential source. In this case, the forcing circuit includes, for example, a fifth P channel MOS transistor connected in series between the third P channel MOS transistor and the high potential source, and a fifth N channel MOS transistor connected in parallel to the third N channel MOS transistor. Both of the fifth N channel MOS transistor and the fifth P channel MOS transistor receive a reset pulse at their gates. As a result, the node between the third P channel and N channel MOS transistors attains a low potential in response to a reset pulse, irrespective of the third external control signal.

In accordance with another preferred embodiment, the second buffer includes, in addition to the first and the second inverters, a threshold voltage deviating circuit for deviating the threshold voltage of the second inverter. The threshold voltage deviating circuit is preferably provided between the first inverter and the second inverter to increase a first threshold voltage corresponding to a switching of the output logical level of the second inverter from a second logical level to a first logical level and decrease a second threshold voltage corresponding to a switching of the output logical level of the second inverter from the first logical level to the second logical level. For example, the threshold voltage deviating circuit includes a P channel MOS transistor provided between the output end of the first inverter and the high potential source and rendered conductive or non-conductive in response to the output of the second inverter and an N channel MOS transistor provided between the output end of the first inverter and the low potential source and rendered conductive or non-conductive in response to the output of the second inverter. In such a case, if a potential fluctuation amount due to noise of the third external control signal immediately after a power supply is less than the difference between the first threshold voltage and the second threshold voltage, the noise does not affect the output logical level of the second inverter.

In accordance with a further aspect of the present invention, the semiconductor memory device according to the present invention includes the above-described memory array, reset pulse generating circuit and internal circuits, test mode designating signal generating circuit responsive to a switching from a first logical level to a second logical level of the third external control signal when first and second external control signals are at a predetermined logical level for generating a test mode designating signal designating a test mode, a first external control signal buffer for buffering the third external control signal at all times without being controlled by a reset pulse and applying the same to the internal circuit and the test mode designating signal generating circuit, a second external control signal buffer for buffering a second external control signal at all the times without being controlled by a reset pulse and applying the same to the internal circuit and the test mode designating signal generating circuit, a first buffer for the third external control signal controlled by a reset signal for buffering the third external control signal and apply the same to the internal circuit only when the reset pulse generating circuit generates no reset pulse, and second buffer for a third external control signal for buffering the third external control signal all the time without being controlled by said reset pulse and applies the same to the test mode designating signal generating circuit.

According to the present invention, therefore, a buffer circuit for inputting an external control signal to a circuit portion for designating a test mode and a buffer circuit for inputting an external control signal to a circuit portion for performing ordinary reading and writing are provided separately from each other. Therefore, not only it is possible, to arrange a buffer circuit applying the external control signal to a test circuit so as not to be controlled by a pulse signal generated for initializing a predetermined circuit portion of a semiconductor memory device at a power supply, but also it is possible to arrange the same to control only the test circuit, thereby preventing the semiconductor memory device from malfunctioning to enter a test mode even when an external control signal does not designate a test mode at a power supply. As a result, highly reliable semiconductor memory device can be obtained having a test circuit on the same chip and not liable to malfunction.

BRIEF DESCRIPTION OF THE DRAWINGS

FIG. 8 is a waveform diagram explaining a detailed operation of the $\overline{RAS}$ input circuit 16 according to the second embodiment.

DESCRIPTION OF THE PREFERRED EMBODIMENTS

Figure 1:
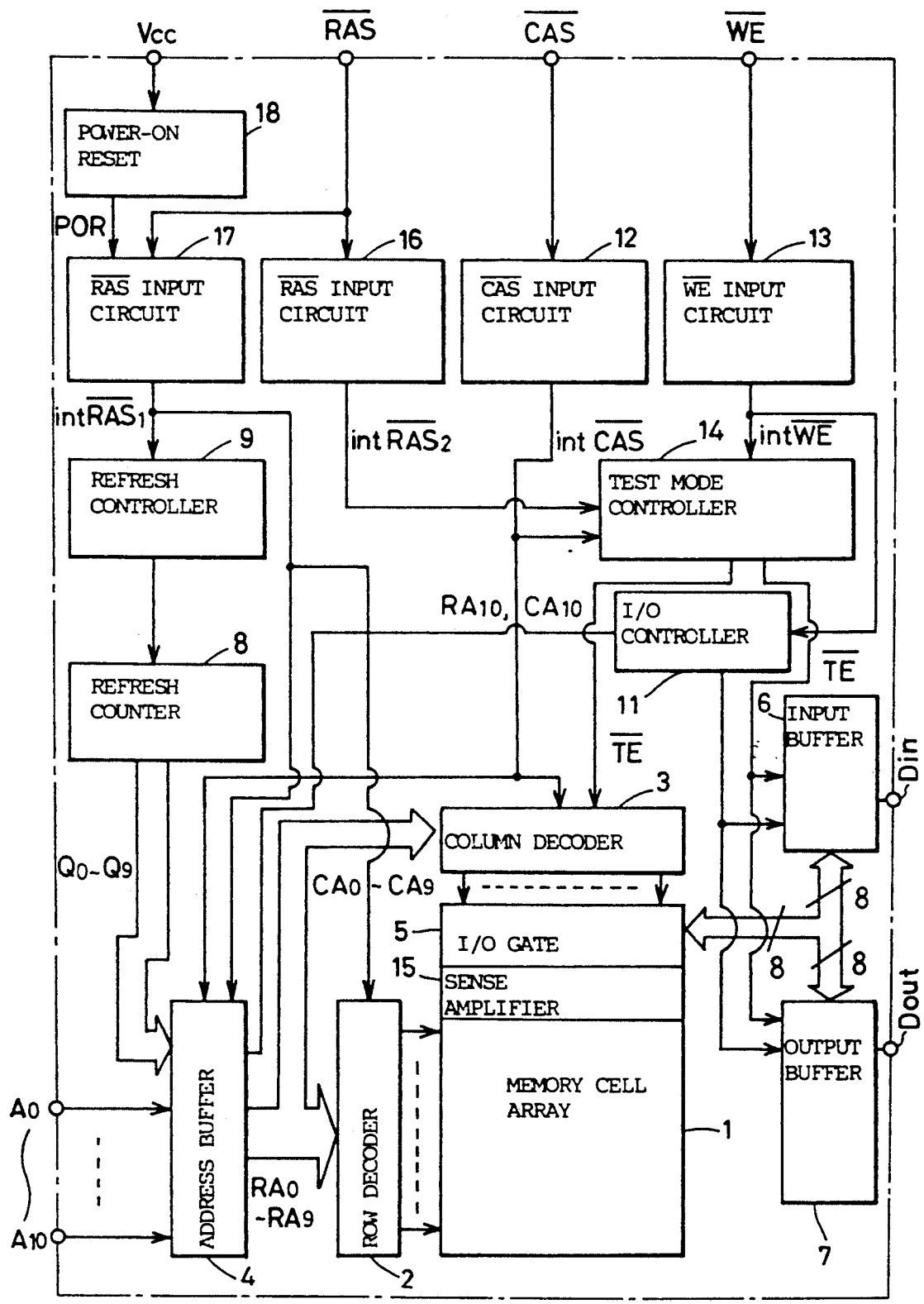
FIG. 1 is a block diagram showing an entire arrangement of a DRAM according to a first and a second embodiment of the present invention.
Figure 13:
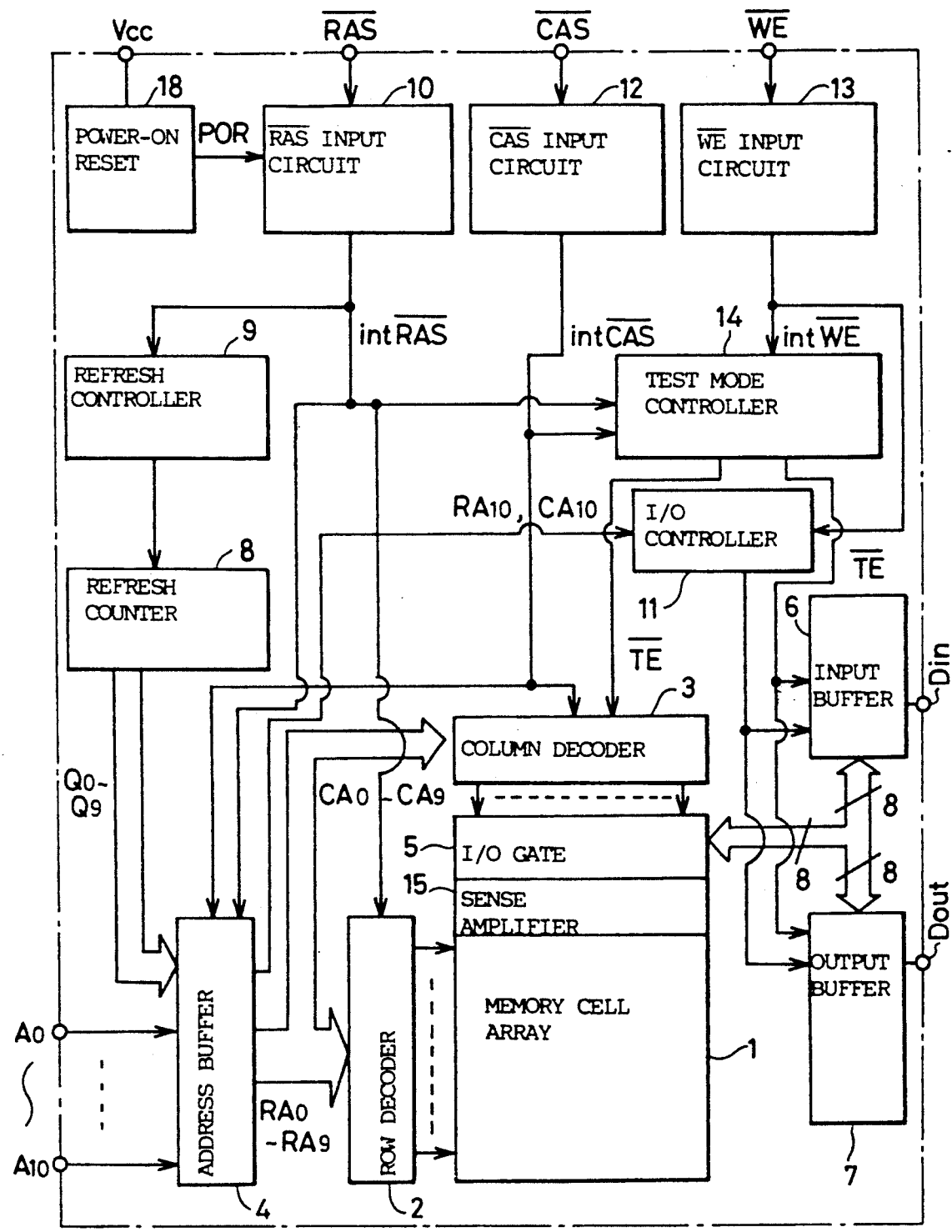
FIG. 13 is a block diagram showing an entire arrangement of a conventional DRAM.

FIG. 1 is a block diagram showing the entire arrangement of a DRAM according to the first embodiment. With reference to FIG. 1, unlike a conventional DRAM shown in FIG. 13, this DRAM comprises a $\overline{RAS}$ input circuit 16 for outputting an internal row address strobe signal int$\overline{RAS}$2 to be applied to a test mode controller 14 and a $\overline{RAS}$ input circuit 17 for outputting an internal row address strobe signal int$\overline{RAS}$1 to be applied to a row decoder 2, an address buffer 4 and a refresh controller 9, which input circuits are individual circuits. The arrangements and operations of the other portions of this DRAM are the same as those of the conventional DRAM shown in FIG. 13.

Figure 2:
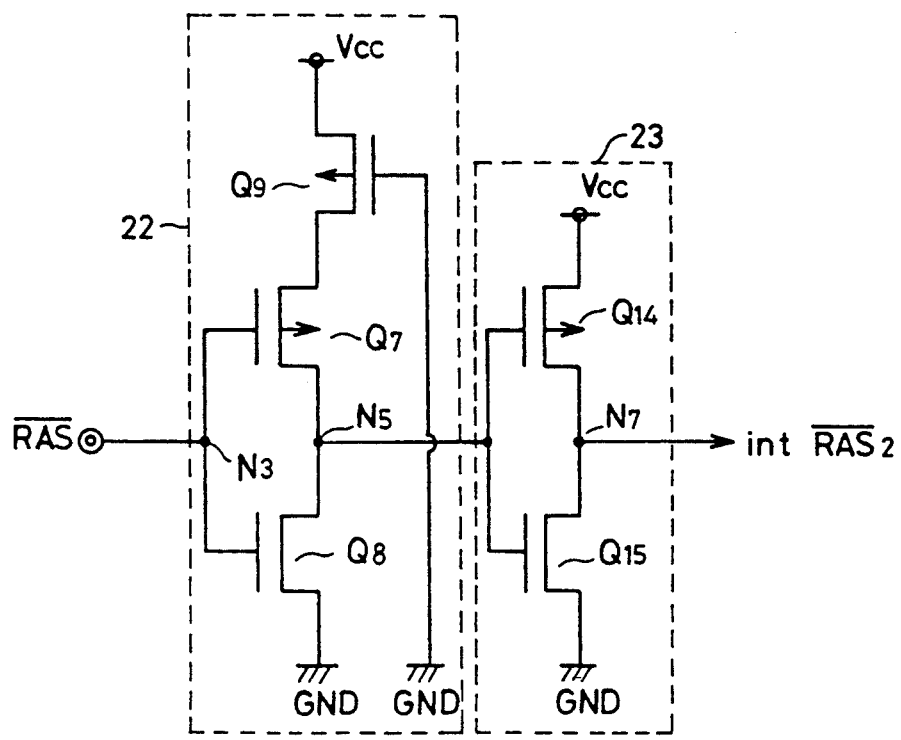
FIG. 2 is a circuit diagram showing an arrangement of a $\overline{RAS}$ input circuit 16 in a DRAM according to the first embodiment.
Figure 3:
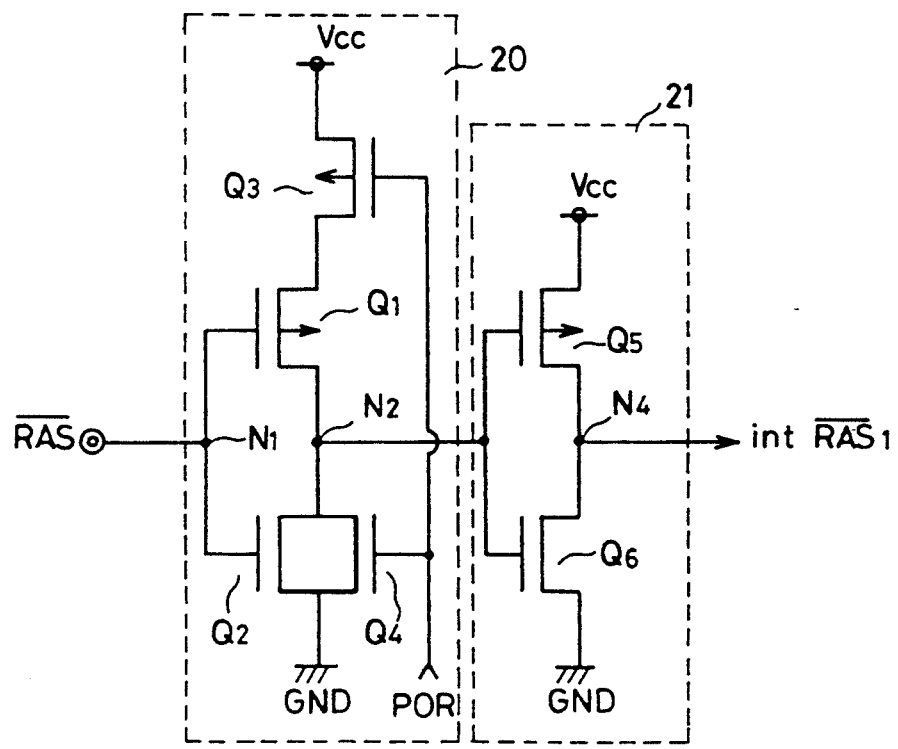
FIG. 3 is a circuit diagram showing an arrangement of a $\overline{RAS}$ input circuit 17 in a DRAM according to each of the first and the second embodiments.

The arrangements and operations of $\overline{RAS}$ input circuits 16 and 17 according to the present embodiment will be described in the following with reference to FIGS. 2 and 3. FIG. 2 is a circuit diagram showing the arrangement of $\overline{RAS}$ input circuit 16 provided for test mode controller 14. FIG. 3 is a circuit diagram showing the arrangement of $\overline{RAS}$ input circuit 17 provided for row decoder 2, address buffer 4 and refresh controller 9.

Figure 16:
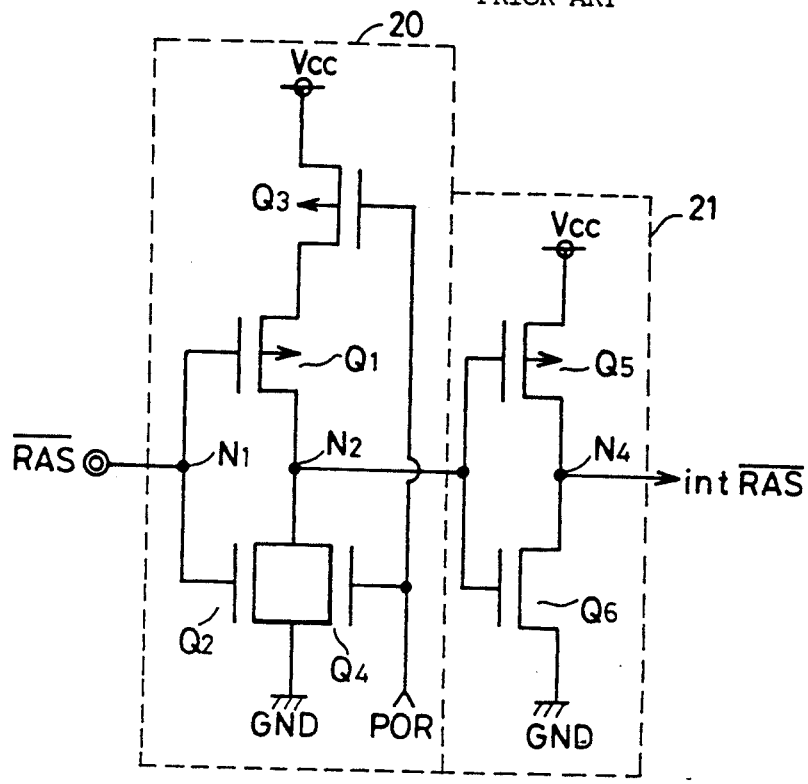
FIG. 16 is a circuit diagram showing an arrangement of a $\overline{RAS}$ input circuit 10 of FIG. 13.
Figure 17:
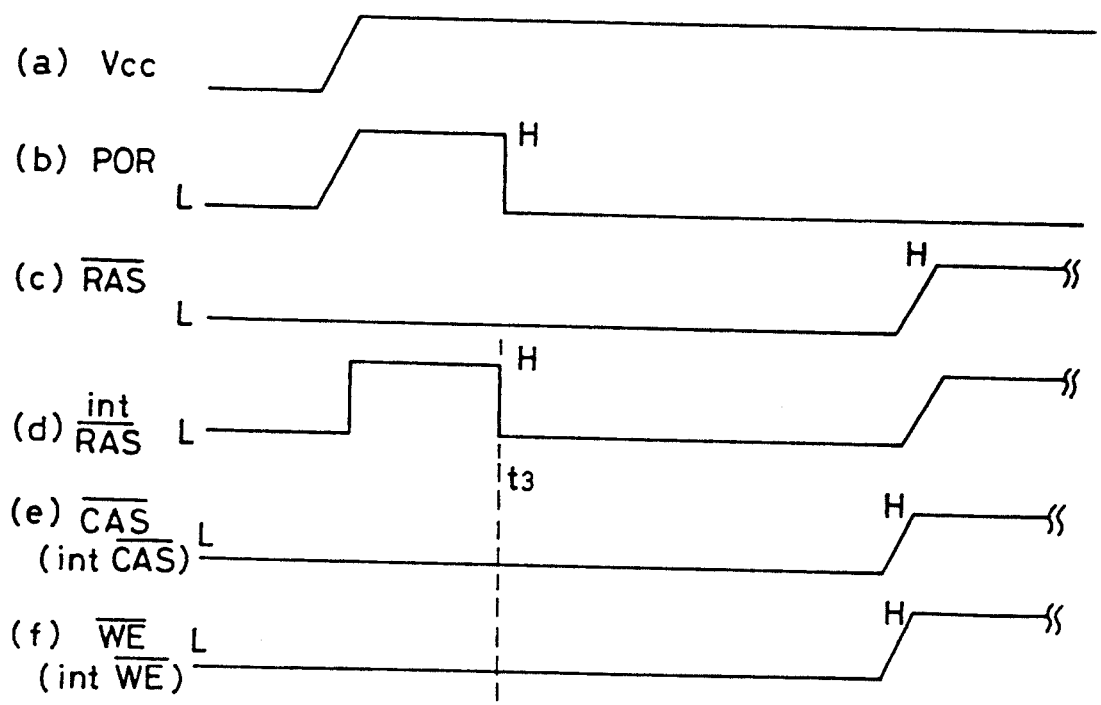
FIGS. 17 to 19 are waveform diagrams explaining a problem of a conventional $\overline{RAS}$ input circuit.
Figure 18:
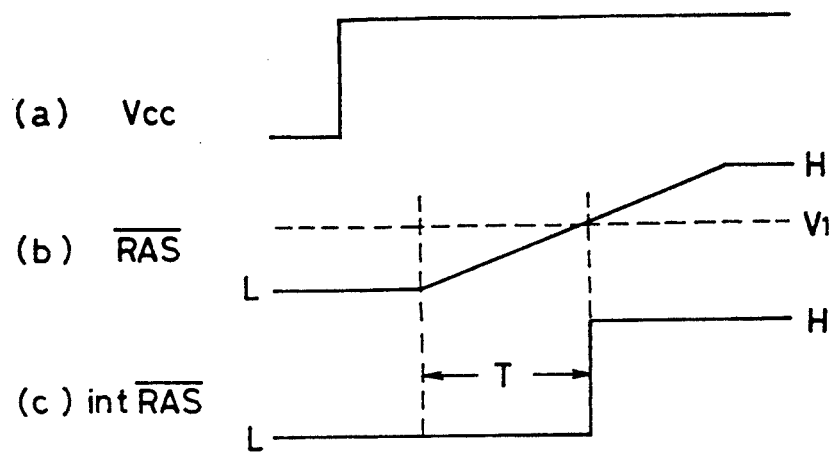
Figure 19:
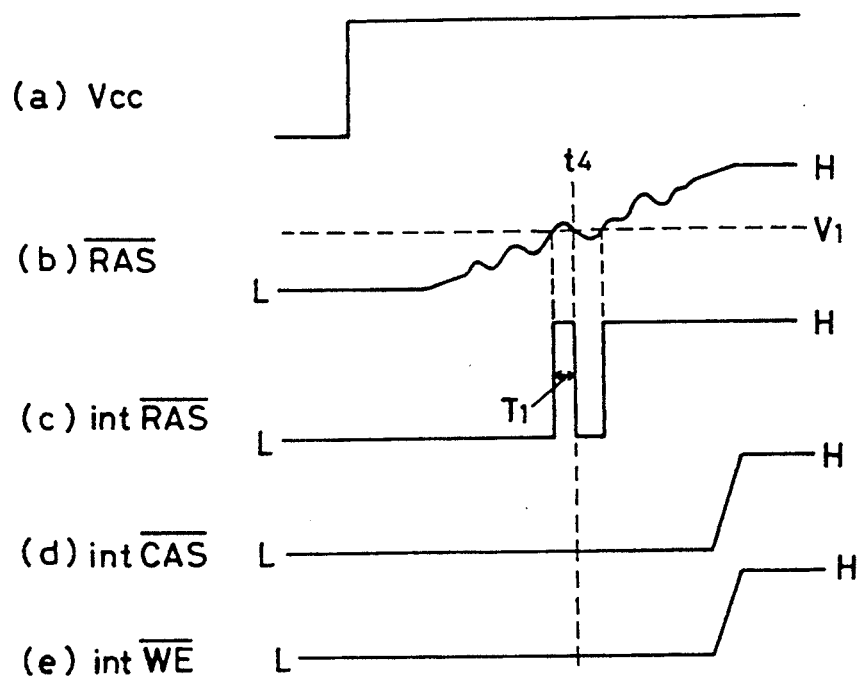

With reference to FIG. 2, similarly to the conventional $\overline{RAS}$ input circuit 10 shown in FIG. 16, $\overline{RAS}$ input circuit 16 includes an inverter 22 receiving an external row address strobe signal $\overline{RAS}$ as an input and an inverter 23 receiving the output of inverter 22 as an input. Unlike inverter 20 of FIG. 16 including transistors Q3 and Q4 (FIG. 16) conventionally provided for activating/inactivating an inverting operation, inverter 22 does not include a transistor Q4 connected to ground GND. Furthermore, transistor Q9 (corresponding to transistor Q3 in FIG. 16) of this inverter 22 has a gate connected to ground GND. The arrangements of the other portions of $\overline{RAS}$ input circuit 16 are the same as those shown in FIG. 16. More specifically, inverter 22 comprises a P channel MOS transistor Q7 and an N channel MOS transistor Q8 receiving external row address strobe signals $\overline{RAS}$ at their gates and inverter 23 comprises a P channel MOS transistor Q14 and an N channel MOS transistor Q15 receiving a potential at an output end N5 of inverter 22 at their gates. Transistors Q7 and Q8, and transistors Q14 and Q15 are connected in series between power supply Vcc and ground GND.

In this $\overline{RAS}$ input circuit 16, transistor Q9 receiving a low potential of ground GND at its gate at all times remains on. Therefore, inverter 22 remains activated at all times, by which an external row address signal $\overline{RAS}$ can be inverted, irrespective of a potential of an output POR of a power-on reset circuit 18 of FIG. 1. As a result, unlike a conventional arrangement, it is not possible that an internal row address strobe signal int$\overline{RAS}$2 applied to test mode controller 14 attains a "H" (logical high) level for a fixed time period in response to a power-on reset signal output from power-on reset circuit 18. In other words, the internal row address strobe signal int$\overline{RAS}$2 is maintained at a "L" (logical low) level until a rise of an external row address strobe signal $\overline{RAS}$ after connection to a power supply. In FIG. 1, therefore, it is not possible that immediately after the power supply, internal row address strobe signal int$\overline{RAS}$2 falls when both of the internal column address strobe signal int$\overline{CAS}$ and the internal write enable signal int$\overline{WE}$ are at a "L" level. As a result, the output $\overline{TE}$ of test mode controller 14 is maintained at a "H" level indicative of an ordinary mode until external control signals $\overline{RAS}$, $\overline{CAS}$ and $\overline{WE}$ designate a test mode, which prevents the DRAM from malfunctioning to enter a test mode in response to output POR of power-on reset circuit 18 after a power supply.

As shown in FIG. 3, $\overline{RAS}$ input circuit 17 has completely the same arrangement as that of the conventional $\overline{RAS}$ input circuit 10 of FIG. 8 (see FIG. 16). Therefore, internal row address strobe signal int$\overline{RAS}$1 applied to row decoder 2, address buffer 4 and refresh controller 9 in FIG. 1 is controlled in response to output POR of power-on reset circuit 18 to attain a "H" level for a fixed time period immediately after a power supply, irrespective of the potential of external row address strobe signal $\overline{RAS}$. As a result, the circuit portion to be controlled in response to external control signal $\overline{RAS}$, that is, row decoder 2, address buffer 4 and refresh controller 9 are initialized at the start of data reading and data writing as in a conventional arrangement.

$\overline{RAS}$ input circuit 16 for test mode controller 14 according to the above-described embodiment prevents, as described above, test mode controller 14 from malfunctioning in response to a power-on reset signal output from power-on reset circuit 18 upon a power supply. $\overline{RAS}$ input circuit 16 according to the above-described embodiment, however, is not capable of preventing test mode controller 14 from malfunctioning when external row address strobe signal $\overline{RAS}$ slowly rises including noise after power supply. A $\overline{RAS}$ input circuit 16 will be described in the following which is also capable of preventing such malfunction of test mode controller 14 due to the noise included in the rising portion of external row address strobe signal $\overline{RAS}$.

Figure 4:
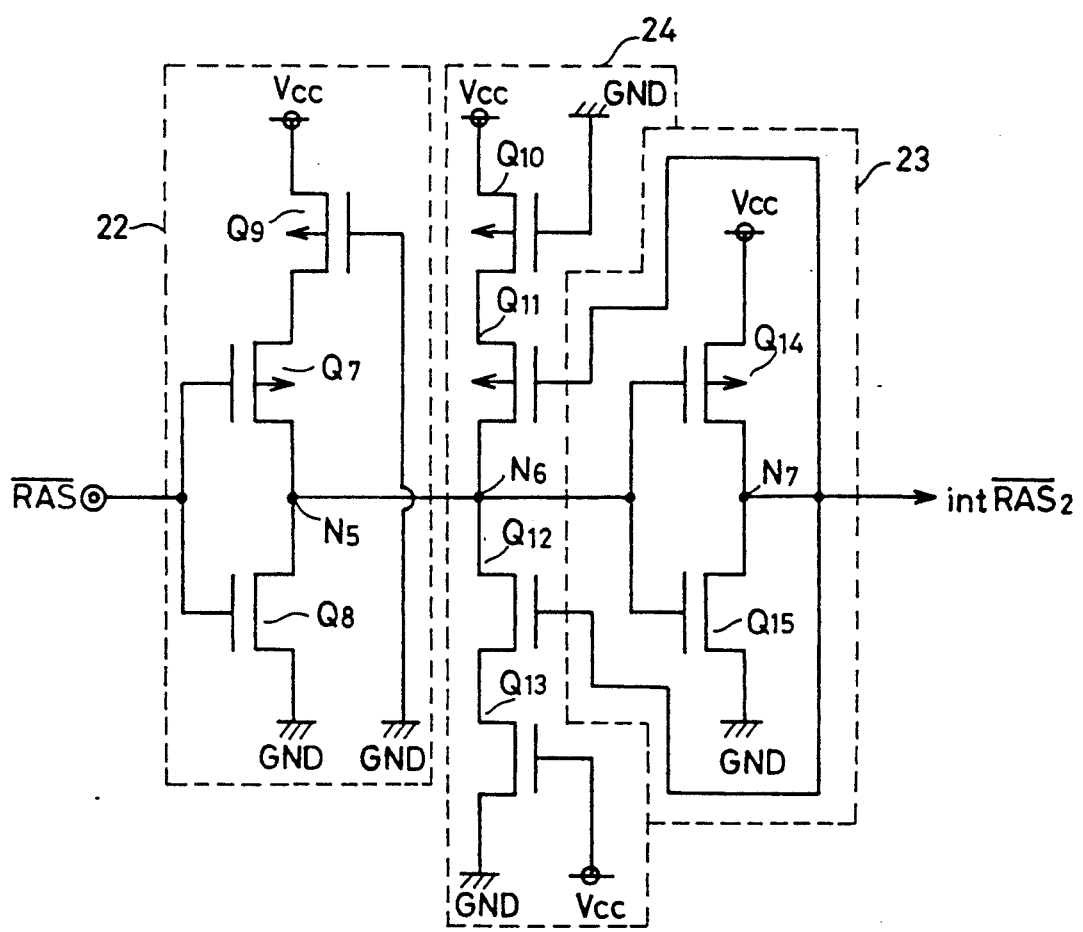
FIG. 4 is a circuit diagram showing an arrangement of a $\overline{RAS}$ input circuit 16 in a DRAM according to the second embodiment.

FIG. 4 is a circuit diagram showing an arrangement of an $\overline{RAS}$ input circuit 16 also capable of preventing test mode controller 14 from malfunctioning due to a rise of output POR of power-on reset circuit 18 and the noise included in the rising portion of external row address strobe signal $\overline{RAS}$ according to a second embodiment of the present invention.

With reference to FIG. 4, unlike the first embodiment (FIG. 2), a high hysteresis buffer is used as this $\overline{RAS}$ input circuit 16, in which buffer hysteresis of an output portion 24 provided between inverter 22 receiving external row address strobe signal $\overline{RAS}$ as an input and inverter 23 receiving the output of inverter 22 as an input. Threshold voltage setting portion 24 includes P channel MOS transistors Q10 and Q11 connected in series between output end N5 of inverter 22 and power supply Vcc, and N channel MOS transistors Q12 and Q13 connected in series between output end N5 of inverter 22 and ground GND. The gate of transistor Q10 is connected to ground GND and the gate of transistor Q13 is connected to power supply Vcc. Transistors Q10 and Q13 therefore remain on at all times. The gates of transistors Q11 and Q12 are connected to an output end N7 of inverter 23.

Figure 5:
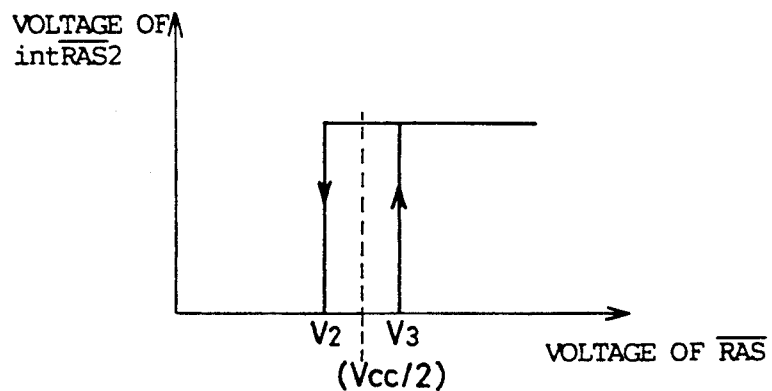
FIGS. 5 through 7 are diagrams explaining operations of the $\overline{RAS}$ input circuit shown in FIG. 4.

Operation of $\overline{RAS}$ input circuit 16 according to the present embodiment will be described in the following with reference to FIGS. 5 and 8 and FIGS. 9A to 9D. FIG. 5 is a diagram of transmission characteristics showing a relation between an input signal (external row address strobe signal $\overline{RAS}$) and an output signal (internal row address strobe signal int$\overline{RAS}$2) in $\overline{RAS}$ input circuit 16 according to the present embodiment. In FIG. 5, the abscissa shows a potential of external row address strobe signal $\overline{RAS}$ and the ordinate shows a potential of internal row address strobe signal int$\overline{RAS}$2.

FIG. 8 is a waveform diagram explaining a potential change of the nodes in this $\overline{RAS}$ input circuit 16 when an external row address strobe signal $\overline{RAS}$ changes from a "L" level to a "H" level and from the same to "L" level. FIGS. 9A to 9D are model diagrams explaining current flow in $\overline{RAS}$ input circuit 16 when the external row address strobe signal $\overline{RAS}$ changes as described above.

In FIGS. 9A to 9D, "x" is attached to a transistor being at an OFF state, "o" is attached to a transistor being at an on state at all times and "arrow" indicates current flow.

It is assumed that the external row address strobe signal $\overline{RAS}$ changes as shown in FIG. 8 (a).

Figure 9A:
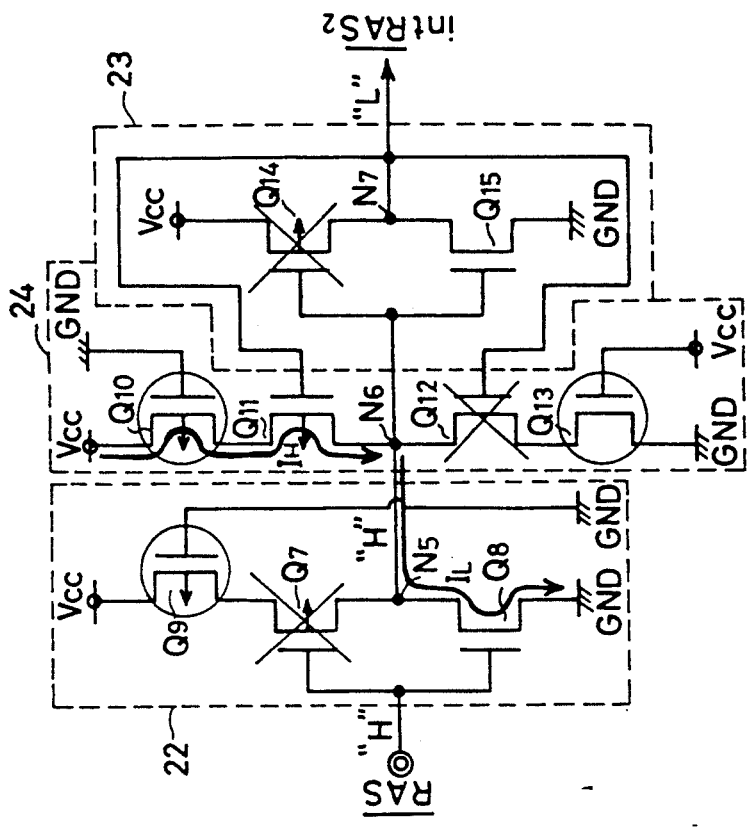
FIGS. 9A to 9D are model diagrams explaining more detailed operations of the $\overline{RAS}$ input circuit 16 according to the second embodiment.
Figure 9B:
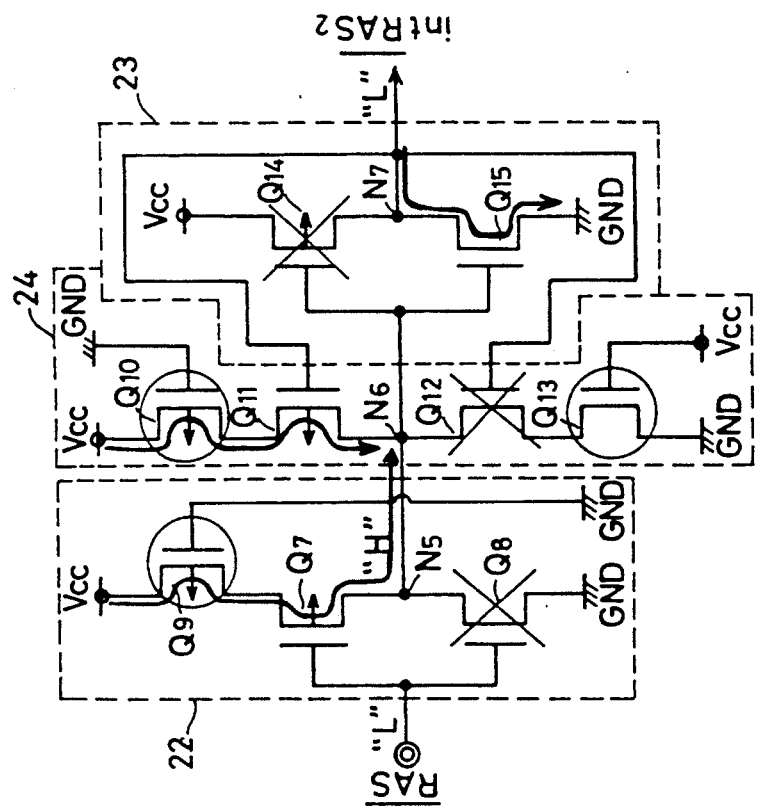
Figure 9C:
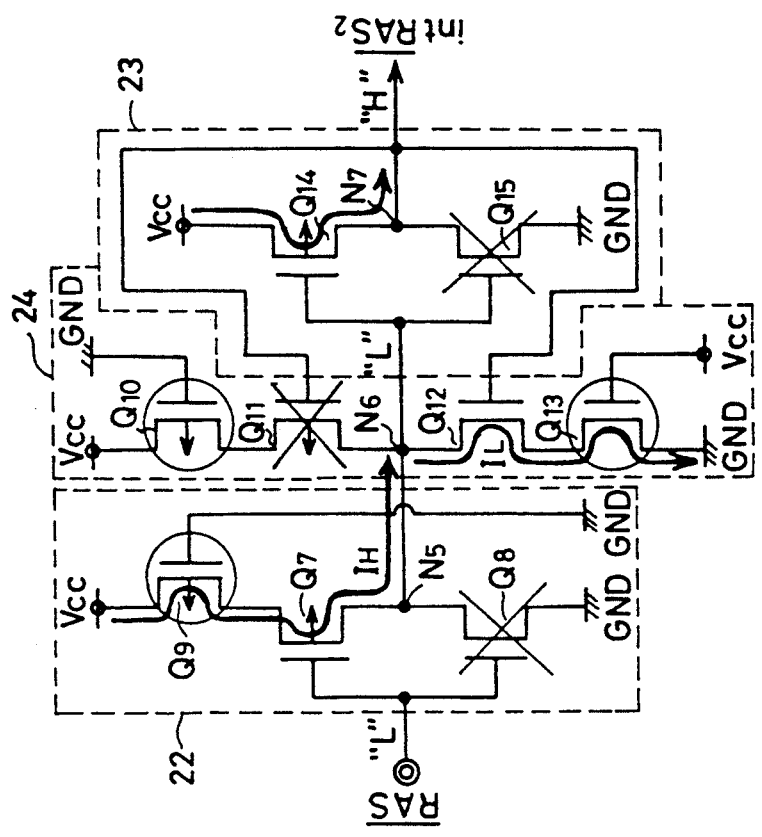

With reference to FIG. 9C, at the time t13 in FIG. 8 when external row address strobe signal $\overline{RAS}$ is at a "H" level, the potential at output end N5 of inverter 22 attains a"L" level, and the potential at output end N7 of inverter 23 is at a "H" level accordingly. Therefore, out of transistors Q11 and Q12 receiving the output of inverter 23 at their gates, transistor Q12 is turned on at this time. The level change of external row address strobe signal $\overline{RAS}$ to"L" at the time t14 in FIG. 9 (d) renders transistor Q7 of inverter 22 conductive to supply power supply voltage Vcc to an input end N6 of inverter 24. However, with reference to FIG. 9D, since transistor Q12 is at an ON state at this time, electric charges are supplied from power supply Vcc to node N6 through transistors Q7 and Q9 and also discharged from node N6 to ground GND through transistors Q12 and Q13. As a result, the potential at node N6 hardly attains a "H" level.

It is assumed that the threshold voltages of inverters 22 and 23 are intermediate potentials (Vcc/2) between the potentials of power supply voltage Vcc and ground GND. In this case, the potential at node N6 attains a "H" level in response to external row address strobe signal $\overline{RAS}$ attaining a potential of Vcc/2 or below without threshold voltage setting portion 24. In other words, the maximum current that transistor Q7 having a gate potential of Vcc/2 is capable to flow $I_H$ from power supply Vcc to node N6 is the minimum current to be supplied from power supply Vcc to node N6 in order to bring the potential at node N6 to a "H" level. However, in the present embodiment wherein node N6 is grounded through transistors Q12 and Q13, part of the current flowing from power supply Vcc to node N6 is drawn to ground GND when transistor Q7 conducts.

Hence, the potential at node N6 does not attain a "H" level even if the gate potential of transistor Q7 is lowered to Vcc/2. In order to bring the potential at node N6 to a "H" level, the gate potential of transistor Q7 should be set lower than Vcc/2 to render transistor Q7 conductive more strongly such that the current is increased which transistor Q7 supplies from power supply Vcc to node N6. Inverter 23 receives the potential at node N6 as an input. Therefore, a reduction in the input potential of inverter 22 required for the potential at node N6 to change from a"L" level to a "H" level corresponds to a reduction in the potential of external row address strobe signal $\overline{RAS}$ allowing the output (internal row address strobe signal int$\overline{RAS}$2) potential of inverter 23 to change from a "H" level to a"L" level. In other words, with transistor Q12 receiving the potential of the output end N7 of inverter 23 at its gate provided between node N6 and ground GND, the threshold voltage V2 of this $\overline{RAS}$ input circuit 16 becomes lower than the respective threshold voltages (Vcc/2) of inverters 23 and 22. That is, when the potential on the external row address strobe signal $\overline{RAS}$ decreases to the potential V2, the current $I_H$ supplied from power supply Vcc to node N6 becomes larger than the current $I_L$ drawn out from node N6 to ground GND and consequently, the potential at node N6 attains a "H" level as shown in FIG. 8 (b).

Therefore the potential of the internal row address strobe signal int$\overline{RAS}$ 2 changes to a"L" level at the time point t15 at which the potential of the external row address strobe signal $\overline{RAS}$ lowers to said potential V2 as shown in FIG. 8 (c). As a result, as shown in FIG. 9A, transistor Q15 conducts in place of transistor Q14 and transistor Q11 conducts in place of transistor Q12 after this time point t15.

Conversely, consideration is now given to a case where the level of external row address strobe signal $\overline{RAS}$ changes from"L" to "H". At the time t10 in FIG. 8 when external row address strobe signal $\overline{RAS}$ is at a"L" level, transistor Q7 of inverter 22 is turned on to bring node N6 to a "H" level, while transistor Q15 of inverter 23 is turned on to bring the potential of node N7 to a "L" level. At this time, out of transistors Q11 and Q12 receiving the potential at node N7 at their gates, transistor Q11 is turned on (see FIG. 9A). A change of external row address strobe signal $\overline{RAS}$ to a "H" level at the time t11 in FIG. 8 renders transistor Q8 of inverter 22 conductive to bring the potential at node N6 to a "L" level. However, with reference to FIG. 9B, with transistor Q11 of threshold voltage setting portion 24 at an ON-state at this time, electric charges are discharged from node N6 to ground through transistor Q8 and also supplied from power supply Vcc to node N6 through transistors Q10 and Q11.

As a result, node N6 more hardly attains a"L" level as compared with a case wherein threshold voltage setting portion 24 is not provided.

With no threshold voltage setting portion provided, the potential at node N6 is fully brought to a"L" level in response to a rise of the potential of external row address strobe signal $\overline{RAS}$ to the threshold voltage (Vcc/2) of inverter 22. In other words, the minimum current to flow from node N6 to ground GND in order to bring the potential at node N6 to"L" level is equivalent to the current which transistor Q8 having a gate voltage of Vcc/2 draws from node N6 to ground GND. However, according to the present embodiment wherein node N6 is connected to power supply Vcc through transistors Q10 and Q11, the current drawn from node N6 to ground GND by transistor Q8 having a gate potential increased to Vcc/2 is virtually smaller than the above-described minimum current. Therefore, the potential at node N6 does not attain a "L" level even if external row address strobe signal $\overline{RAS}$ rises to Vcc/2.

In order to bring the potential at node N6 to a "L" level, therefore, the gate potentials of transistor Q8 should be brought higher than Vcc/2 to increase the current $I_L$ in FIG. 9B drawn by transistor Q8 from node N6 to ground GND. That is, the input potential of inverter 22 enabling the potential at node N6 to be brought to a "L" level becomes higher than Vcc/2, which results in an increase in the potential of external row address strobe signal $\overline{RAS}$ enabling the potential at node N7 to be brought to a "H" level because inverter 23 receives the potential at node N6 as an input. In other words, according to the present embodiment wherein transistor Q11 receiving the output of inverter 23 at its gate is provided between node N6 and power supply Vcc, the threshold voltage V3 of $\overline{RAS}$ input circuit 16 becomes higher than the respective threshold voltages (Vcc/2) of inverters 23 and 22. That is, when the potential of the external row address strobe signal $\overline{RAS}$ increases to the potential V3, the current $I_L$ drawn from node N6 to ground GND becomes larger than the current $I_H$ supplied from power supply Vcc to node N6 in FIG. 9B, and the potential at node N6 attains a "L" level as shown in FIG. 8 (b).

Therefore, the potential of the internal row address strobe signal intRAS changes to a "H" level at the time point t12 at which the external row address strobe signal RAS increases to said potential V3 as shown in FIG. 8 (c). As a result, as shown in FIG. 9C, transistor Q14 and transistor Q12 conduct in place of transistor Q15 and transistor Q11, respectively, from the time point t12 at which the external row address strobe signal RAS increases to the potential V3 until the time point t15 at which the same decreases to the potential V2.

As described above, the threshold voltage of RAS input circuit 16 according to the present embodiment widely varies from a case where an input signal level (external row address strobe signal RAS) changes from "H" to "L" to a case where the input signal level changes from "L" to "H". More specifically, with reference to FIG. 5, as the potential of external row address strobe signal RAS rises from 0 V, the potential of internal row address strobe signal intRAS2 attains a "H" level when the potential of external row address strobe signal RAS becomes V3 higher than, for example, Vcc/2. Conversely, as the potential level of external row address strobe signal RAS falls from "H" level toward 0 V, the potential of internal row address strobe signal intRAS2 attains a "L" level when the potential of external row address strobe signal RAS becomes V2 or below which is lower than, for example, Vcc/2. Fluctuation in the potential of external row address strobe signal RAS between V2 and V3 therefore does not change the logical level of the potential of internal row address strobe signal intRAS2.

Figure 6:
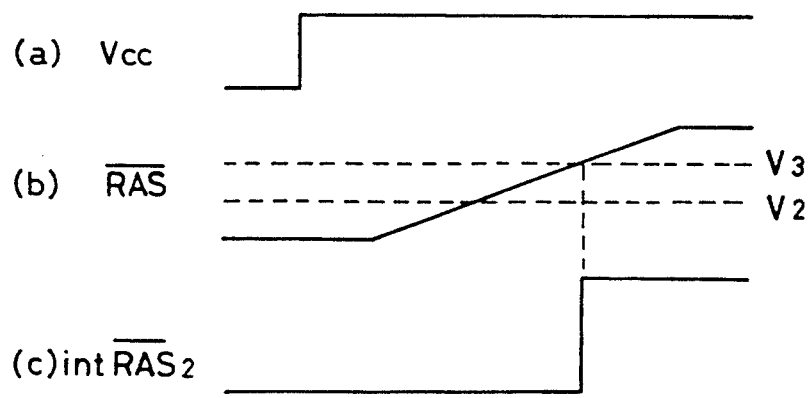
Figure 7:
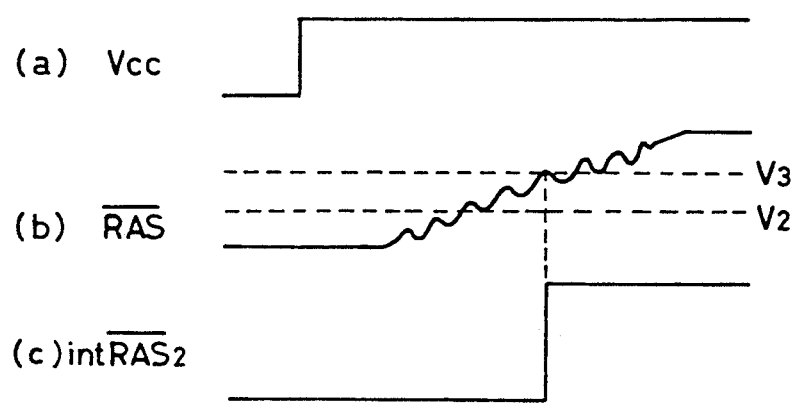

With reference to FIGS. 6 and 7, description will be given of operation of RAS input circuit 16 according to the present embodiment when external row address strobe signal RAS rises slowly after a power supply. FIG. 6 is a waveform diagram showing operation of RAS input circuit 16 when external signal RAS smoothly rises without noise after the power supply. FIG. 7 is a waveform diagram showing operation of RAS input circuit 16 when external signal RAS slowly rises with noise after the power supply.

With reference to FIG. 6, when external signal RAS rises slowly from a "L" level toward a "H" level as shown in FIG. 6(b) after the rise of power supply potential Vcc (FIG. 6(a)) upon a power supply, more time is required for the potential at the input end of inverter 22 of FIG. 4 to exceed the lowest potential level V3 enabling the potential at node N6 to be brought to a "L" level. As shown in FIG. 6(c), similarly in a conventional one, the potential level at node N7 of FIG. 4 (the potential of internal row address strobe signal intRAS2) is changed to a "H" level later by a certain time period than the start of the external signal RAS rise.

Figure 14:
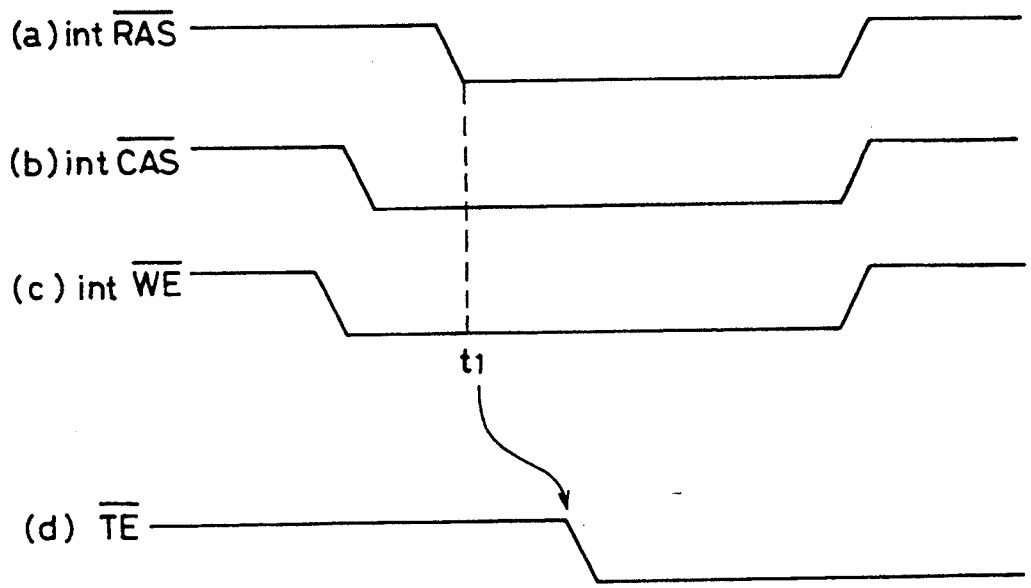
FIGS. 14 and 15 are waveform diagrams explaining operations of a test mode controller of FIG. 13.
Figure 15:
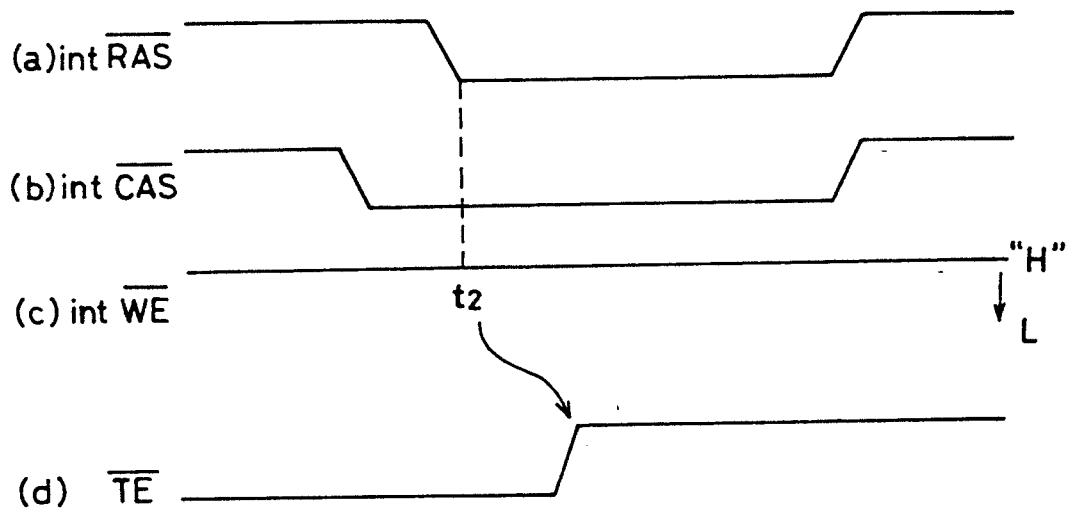

With reference to FIG. 7, it is now assumed that not only is the external signal RAS late in starting to rise after a rise of power supply voltage Vcc (FIG. 7(a)) upon a power supply connection but also external signal RAS includes noise at this rise as shown in FIG. 7(b). In such a case, the potential level of internal signal intRAS2 changes to a "H" level in the course of the rise of the RAS signal as shown in FIG. 7(c), when the potential of external signal RAS exceeds, due to noise, the lowest voltage V3 of the input potential of inverter 22 enabling the potential of node N6 to be brought to a "L" level in FIG. 4. However, even if the potential of external signal RAS is again reduced below the potential V3 due to noise, it is not possible that the internal signal intRAS2 level changes to "L" unless the potential drop of external signal RAS due to noise exceeds the difference voltage (V3−V2) between the potentials V2 and V3. Hence, the logical level of the potential of internal signal RAS2 is fixed to "H" at a time point when the potential of external signal RAS exceeds the threshold voltage V3 of RAS input circuit 16 due to noise. If the difference voltage (V3−V2) is set sufficiently larger than the amplitude of the noise included at the rise of external signal RAS. In other words, even if the potential of external signal RAS fluctuates centered on the threshold voltage V3 of RAS input circuit 16 due to noise when external signal RAS rises for the first time after activation of the power supply, there is no possibility of such fluctuation causing a conventional false fall in internal signal intRAS2 (see FIG. 14).

According to RAS input circuit 16 of the present embodiment, therefore, even if external row address strobe signal RAS rises slowly with noise after connection of a power supply, the logical level of the potential of internal row address strobe signal intRAS2 changes corresponding only to the original potential change of external row address strobe signal RAS. As a result, even when column address strobe signal CAS and external write enable signal WE rise after a rise of external row address strobe signal RAS upon a power supply in FIG. 1, it is not possible for internal row address strobe signal intRAS2 to fall when both of the internal column address strobe signal intCAS and the internal write enable signal intWE are at a "L" level. Therefore, test enable signal TE indicative of a test mode is not erroneously output from test mode controller 14.

Figure 10:
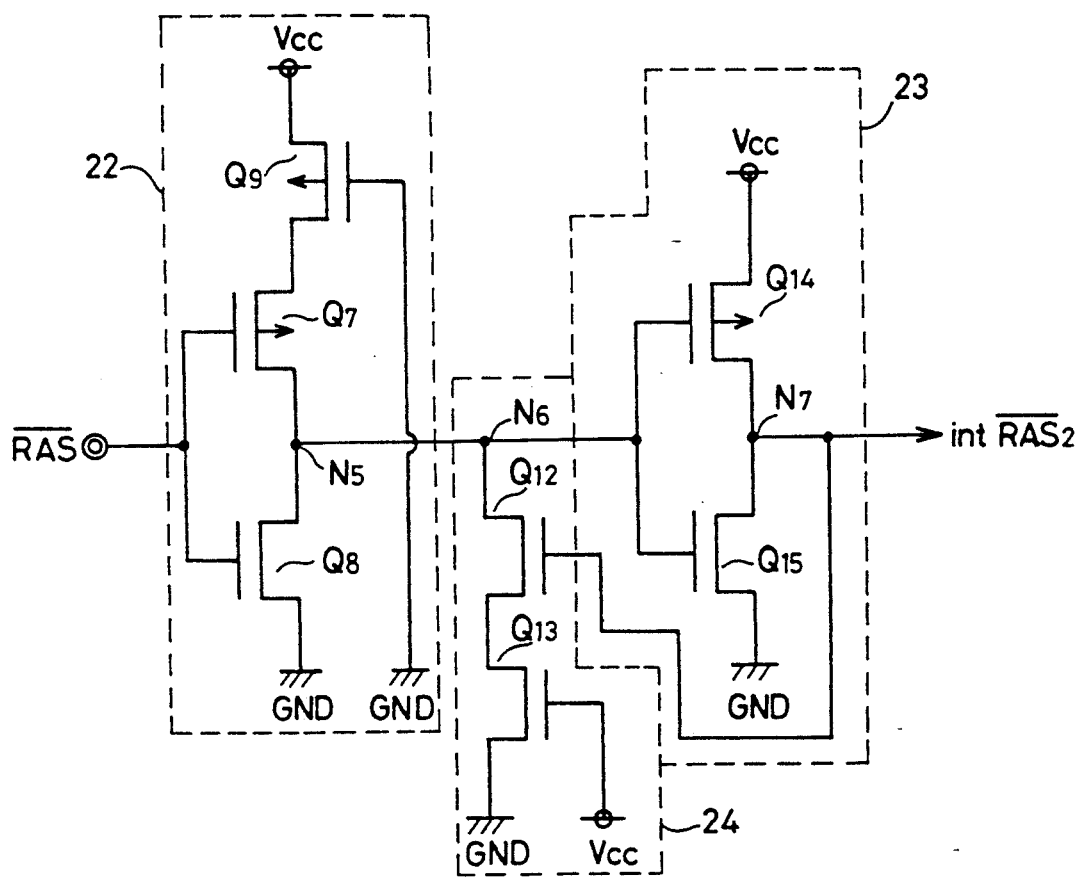
FIG. 10 is a circuit diagram showing an arrangement of a $\overline{RAS}$ input circuit in a DRAM according to a third embodiment.
Figure 11:
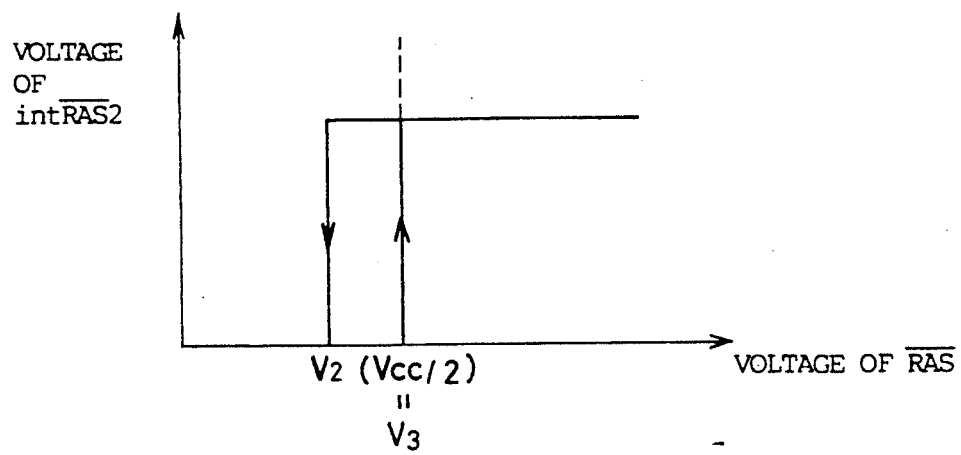
FIGS. 11 and 12 are diagrams explaining operations of the $\overline{RAS}$ input circuit shown in FIG. 10.

While threshold voltage setting portion 24 includes both of a transistor provided between node N6 and power supply Vcc and a transistor provided between node N6 and ground GND, the portion may be arranged without the former transistor. FIG. 10 is a circuit diagram showing an arrangement of the RAS input circuit 16 in such a case and shows a third embodiment of the present invention. FIG. 11 is a diagram showing transmission characteristics of the RAS input circuit shown in FIG. 10.

With reference to FIG. 10, threshold voltage setting portion 24 in the RAS input circuit according to the present embodiment includes only transistors Q12 and Q13 connected in series between node N6 and ground GND.

According to the present embodiment, therefore when the potential of the internal row address strobe signal intRAS2 is at a "L" level, transistor Q12 is turned so that RAS input circuit 16 operates in the same manner as in a case where RAS input circuit 16 is arranged without threshold voltage setting portion 24. More specifically, the potential at node N6 attains a "H" level at a time point at which the potential of the external row address strobe signal RAS is increased from ground potential 0 V to the potential Vcc/2, half the power supply potential Vcc, and consequently, the potential of the internal of the row address strobe signal intRAS2 attains a "H" level. Therefore, the threshold voltage V3 of the RAS input circuit according to the present embodiment when the external row address strobe signal RAS is being increased is equal to a threshold voltage Vcc/2 of an inverter 22, 23 (see FIG. 11).

Figure 9D:
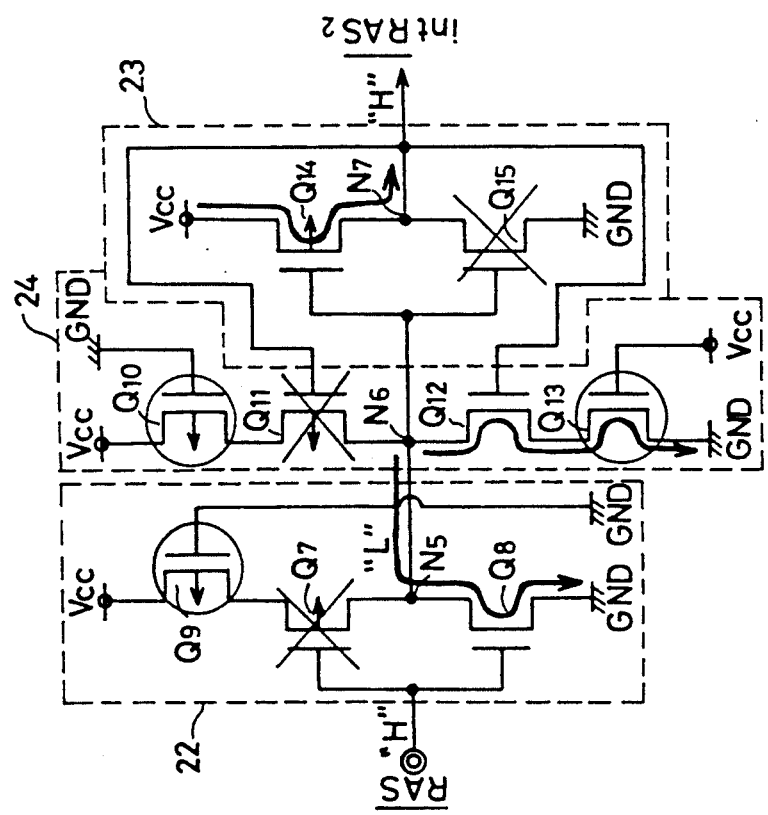

Conversely, when the internal row address strobe signal intRAS2 is at a "H" level, transistor Q12 is turned on, so that the same phenomenon as shown in FIG. 9D occurs in this RAS input circuit at a time point at which the external row address strobe signal RAS lowers from the power supply potential Vcc to the threshold voltage Vcc/2 of an inverter 22, 23. As a result, the threshold voltage V2 of the RAS input circuit with the external row address strobe signal RAS being lowered becomes lower than the threshold voltage Vcc/2 of an inverter 22, 23 (see FIG. 11).

In the present embodiment, transistors larger in size than those used in the previous embodiment are used as transistors Q12 and Q13. As a result, the current $I_L$ drawn out from node N6 to ground GND becomes larger in FIG. 9D to make the difference between the threshold voltage V2 and the threshold voltage V3 approximately equal to that in the previous embodiment. Accordingly, if an amplitude of noise generated at a rise of the external signal RAS is insignificantly large, the noise does not affect a logical level of the potential of the internal signal RAS.

Figure 12:
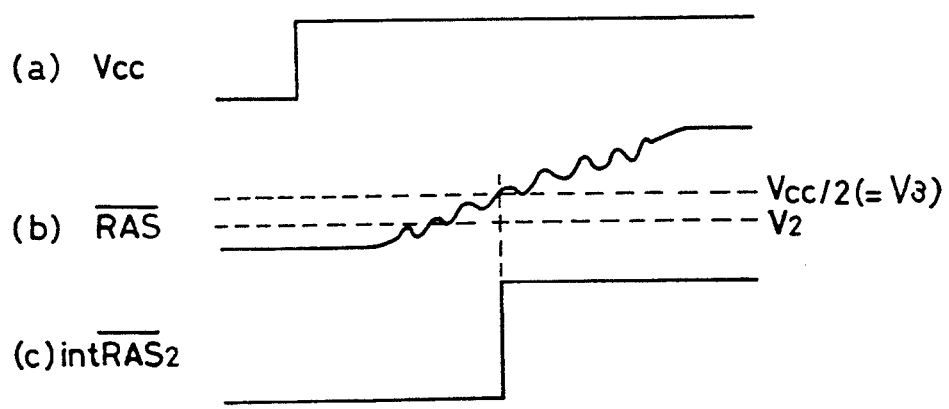

This effect will be described in more detail with reference to FIG. 12. FIG. 12 is a waveform diagram showing a potential change of the internal signal intRAS2 when the external signal RAS rises with noise included therein.

It is assumed that the external signal RAS slowly rises with noise included therein as shown in FIG. 12 (b) in response to a rise of power supply potential Vcc (FIG. 12 (a)) at the application of power. In such a case, in the RAS input circuit according to the present embodiment, the potential of the internal signal intRAS2 (FIG. 12 (c)) rises to a "H" level at a time point at which the potential of the external signal RAS exceeds the potential V3 in FIG. 11, that is, Vcc/2. Thereafter, even if the potential of the external signal RAS becomes lower than this potential (vcc/2) due to noise, the logical level of the internal signal intRAS2 is not changed unless the potential of the external signal RAS becomes lower than the potential V2 in FIG. 11. In other words, the present embodiment also avoids output of a test enable signal TE erroneously designating a test mode from test mode controller 14 in response to noise at a rise of the external signal RAS.

The threshold voltage V2 depends on the current which can be drawn from node N6 to ground GND in threshold voltage setting portion 24 of FIG. 4 and the threshold voltage V3 depends on the current which can be supplied from power supply Vcc to node N6 in threshold voltage setting portion 23. The difference between the threshold voltages V2 and V3 can be therefore arbitrarily changed depending on the number, the sizes and the like of N channel MOS transistors provided between node N6 and ground GND in threshold voltage setting portion 24 or by adjusting the number, the sizes and the like of P channel MOS transistors provided between node N6 and power supply Vcc.

The larger the difference between the two threshold voltages V2 and V3 of RAS input circuit 16 according to the present embodiment is, the larger becomes the noise amplitude at a rise of external row address strobe signal RAS, which is necessary to cause test mode controller 14 to malfunction. However, too large a difference between the threshold voltages V2 and V3 for increasing an operation margin of test mode controller 14 prevents the logical level of internal row address strobe signal intRAS2 from quickly changing following the potential change of external row address strobe signal RAS. As a result, more time is required for setting the semiconductor memory device to operate in a test mode and for returning the semiconductor memory device from a test mode to a normal mode. Thus, the difference between threshold voltages V2 and V3 should be set to an adequate value in consideration with such time delay.

Although in any of the above-described embodiments, output POR of power-on reset circuit 18 is applied to RAS input circuit 17 as shown in FIG. 1, the output can be directly applied to a circuit in the stage succeeding to the RAS input circuit. In such a case, RAS input circuit 16 connected to test mode controller 14 and RAS input circuit 17 connected to other circuits than test mode controller 14 should be provided separately. For example, an RAS input circuit 17 for buffering external row address strobe signal RAS as structured as shown in FIG. 4 or FIG. 10 if used only as a replacement for the RAS input circuit 10 of FIG. 13 will have the following problems. The level of internal row address strobe signal intRAS would change from "L" to "H" only when the potential of external row address strobe signal RAS becomes much higher than a conventional threshold voltage V1 (Vcc/2 in general) and would change from "H" to "L" only when the potential of the same becomes much lower than the conventional threshold voltage V1. Hence, as above described, the operation margin of RAS input circuit 10 for input signal RAS would be reduced and the access time for reading and writing in the normal mode is increased.

However, separate provision of RAS input circuit 16 for test mode controller 14 and RAS input circuit 17 for a circuit for ordinary data reading and writing enables a use of such high hysteresis buffer having a large different voltage between threshold voltages V2 and V3 as shown in FIGS. 4 and 10 only for the RAS input circuit 16 and a use of such a buffer having no or a small different voltage between threshold voltages V2 and V3 as the conventional buffer for the RAS input circuit 17. Therefore, it is not possible that the operation margin of a DRAM for external control signal RAS is reduced in ordinary reading and writing and that the access time for reading and writing in the normal mode is increased.

Although the above-described two embodiments show the cases wherein the present invention is applied to a DRAM, the present invention is applicable in general to a semiconductor memory device whose test mode is designated in response to external control signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array,
   internal circuit means associated with data reading from said memory cell array and data writing to the same,
   reset pulse generating means responsive to a power supply for initializing said internal circuit means,
   said internal circuit means operating in response to an external control signal after the output of said reset pulse from said reset pulse generating means, test mode designating signal generating means responsive to said external control signal for generating a test mode designating signal designating a test mode, a first buffering means for buffering said external control signal and applying the same to said internal circuit means only when said reset pulse is not generated from said reset pulse generating means, and second buffering means for buffering said external control signal at all times and applying the same to said test mode designating signal generating means.

2. The semiconductor memory device according to claim 1, wherein said external control signal includes first, second and third signals, and said test mode designating signal generating means generates said test mode designating signal in response to a combination of the logical levels of the potentials of said first, second and third signals.

3. The semiconductor memory device according to claim 2, wherein when said first and second signals are at the first logical level, said test mode designating signal generating means generates said test mode designating signal in response to a change in the logical level of said third signal from said first logical level to a second logical level.

4. The semiconductor memory device according to claim 3, wherein said second buffering means includes first inverting means for inverting said third external control signal and second inverting means inverting the output of said first inverting means.

5. The semiconductor memory device according to claim 4, wherein said second buffering means further includes threshold voltage deviating means for deviating the threshold voltage of said second inverting means.

6. The semiconductor memory device according to claim 5, wherein said threshold voltage deviating means is provided between said first inverting means and said second inverting means and reduces a first threshold voltage corresponding to a switching of the output logical level of said second inverting means from said first logical level to said second logical level.

7. The semiconductor memory device according to claim 6, wherein said threshold voltage deviating means further increases a second threshold voltage corresponding to a switching of the output logical level of said second inverting means from said second logical level to said first logical level.

8. The semiconductor memory device according to claim 6, wherein said threshold voltage deviating means includes:

switching means provided between the output of said first inverting means and a low potential source and controlled by the output of said second inverting means.

9. The semiconductor memory device according to claim 7, wherein said threshold voltage deviating means includes:

first switching means provided between the output of said first inverting means and a high potential source and controlled by the output of said second inverting means, and second switching means provided between the output of said first inverting means and a low potential source and controlled by the output of said second inverting means.

10. The semiconductor memory device according to claim 8, wherein said switching means includes a field effect semiconductor element having a first conduction terminal receiving the output of said first inverting means, a second conduction terminal connected to said low potential source and a control terminal receiving the output of said second inverting means.

11. The semiconductor memory device according to claim 9, wherein said first switching means includes a first field effect semiconductor element of a first polarity having a first conduction terminal receiving the output of said first inverting means, a second conduction terminal connected to said high potential source and a control terminal receiving the output of said second inverting means, and said second switching means includes a second field effect semiconductor element of a second polarity opposite to said first polarity having a first conduction terminal receiving the output of said first inverting means, a second conduction terminal connected to said low potential source and a control terminal receiving the output of said second inverting means.

12. The semiconductor memory device according to claim 4, wherein said first buffering means includes:

third inverting means inverting said third external control signal, fourth inverting means inverting the output of said third inverting means, and forcing means responsive to said reset pulse for temporarily forcing the output of said third inverting means to a predetermined potential.

13. The semiconductor memory device according to claim 5, wherein said first buffering means includes:

third inverting means inverting said third external control signal, fourth inverting means inverting the output of said third inverting means, and forcing means responsive to said reset pulse for temporarily forcing the output of said third inverting means to a predetermined potential.

14. The semiconductor memory device according to claim 10, wherein said first inverting means includes two field effect semiconductor elements connected in series between said high potential source and said low potential source, having polarities complementary to each other and controlled by said third external control signal, and said second inverting means includes two field effect semiconductor elements connected in series between said high potential source and said low potential source, having polarities complementary to each other and controlled by the potential at a node between said two field effect semiconductor elements.

15. The semiconductor memory device according to claim 11, wherein said first inverting means includes two field effect semiconductor elements connected in series between said high potential source and said low potential source, having polarities complementary to each other and controlled by said third external control signal, and said second inverting means includes two field effect semiconductor elements connected in series between said high potential source and said low potential source, having polarities complementary to each other and controlled by the potential at a node between said two field effect semiconductor elements.

16. The semiconductor memory device according to claim 12, wherein
said third inverting means includes two field effect semiconductor elements connected in series between a high potential source and a low potential source, having polarities complementary to each other and controlled by said third external control signal,
said fourth inverting means includes two field effect semiconductor elements connected in series between said high potential source and said low potential source, having polarities complementary to each other and controlled by the potential at a node between said two field effect semiconductor elements, and
said forcing means includes a field effect semiconductor element connected in parallel to one of said two field effect semiconductor elements included in said third inverting means, responsive to said reset pulse for conducting and having the same polarity as that of said one element, and a field effect semiconductor element connected in series to the other element of said two field effect semiconductor elements included in said third inverting means, responsive to said reset pulse for entering a nonconductive state and having the same polarity as that of said the other element.

17. The semiconductor memory device according to claim 13, wherein
said third inverting means includes two field effect semiconductor elements connected in series between a high potential source and a low potential source, having polarities complementary to each other and controlled by said third external control signal,
said fourth inverting means includes two field effect semiconductor elements connected in series between said high potential source and said low potential source, having polarities complementary to each other and controlled by the potential at a node between said two field effect semiconductor elements, and
said forcing means includes a field effect semiconductor element connected in parallel to one of said two field effect semiconductor elements included in said third inverting means, responsive to said reset pulse for conducting and having the same polarity as that of said one element, and a field effect semiconductor element connected in series to the other element of said two field effect semiconductor elements included in said third inverting means, responsive to said reset pulse for entering a nonconductive state and having the same polarity as that of said the other element.

18. The semiconductor memory device according to claim 6, wherein the difference between said first threshold voltage and said second threshold voltage V3 corresponding to a switching of the output level of said second inverting means from said second logical level to said first logical level is larger than the potential fluctuation amount of said third external control signal due to noise immediately after said power supply.

19. The semiconductor memory device according to claim 7, wherein the difference between said first threshold voltage and said second threshold voltage is larger than the potential fluctuation amount of said third external control signal due to noise immediately after said power supply.

20. A semiconductor memory device comprising:
a memory cell array;
control means for controlling normal reading and writing operations of said memory cell array in response to an external control signal, said control means comprising a first buffer means for buffering said external signal and reset means responsive to a power supply for initializing said first buffer means;
test mode designating means for controlling initiation and termination of a test operation of said memory cell array in response to said external control signal; and
a second buffer means for buffering said external control signal, said test mode designating means connected to an output of said second buffer means.

21. The semiconductor memory device according to claim 20 wherein said second buffer means comprises a first inverting means for inverting said external control signal and a second inverting means for inverting an output of said first inverting means and an output of said second inverting means is connected to said test mode designating means.

22. The semiconductor memory device according to claim 21, wherein said second buffer means further includes threshold voltage setting means for setting a threshold voltage of said second inverting means at a first level for an increased change in voltage input to said second inverting means and at a second level for a decreased change in voltage input to said second inverting means.

23. The semiconductor memory device according to claim 22, wherein said first level is higher than said second level.

24. A semiconductor memory device capable of performing normal mode and test mode operation, comprising:
a memory cell array;
control means for controlling normal reading and writing operations of said memory cell array in response to an external control signal;
test mode designating means for setting and resetting test mode operation of said memory cell array in response to said control means;
said control means comprising a first buffer means comprising a plurality of inverters for buffering said external signal and a second buffer means comprising a plurality of inverters for buffering said external control signal, said second buffer means having a higher hysteresis voltage threshold level than said first buffer means; and
said test mode designating means connected to an output of said second buffer means.

25. The semiconductor memory device according to claim 24, wherein
said external control signal includes first, second and third signals, and
said test mode designating means generates a test mode designating signal in response to a combination of the logical levels of the potentials of said first, second and third signals.

26. The semiconductor memory device according to claim 25, wherein when said first and second signals are at the first logical level, said test mode designating means generates said test mode designating signal in response to a change in the logical level of said third signal from said first logical level to a second logical level.

27. The semiconductor memory device according to claim 25, wherein said second buffering means includes first inverting means for inverting said third external control signal and second inverting means inverting the output of said first inverting means.

28. The semiconductor memory device according to claim 27, wherein said second buffering means further includes threshold voltage deviating means for deviating the threshold voltage of said second inverting means.

29. The semiconductor memory device according to claim 28, wherein said threshold voltage deviating means is provided between said first inverting means and said second inverting means and reduces a first threshold voltage corresponding to a switching of the output logical level of said second inverting means from said first logical level to said second logical level.

30. The semiconductor memory device according to claim 29, wherein said threshold voltage deviating means further increases a second threshold voltage corresponding to a switching of the output logical level of said second inverting means from said second logical level to said first logical level.

31. A semiconductor memory device comprising:
a memory cell array formed on a semiconductor substrate and comprising a plurality of memory cells arranged in rows and columns;
a plurality of word lines formed on said substrate and corresponding to said rows of memory cells;
a row decoder formed on said substrate for decoding an applied address signal corresponding to a selected word line;
a test mode control means formed on said substrate for generating a test mode signal for setting said device to test mode operation;
a first input buffer means formed on said substrate for applying a first internal address strobe signal to said row decoder in response to an external row address strobe signal and a voltage level of a power on reset signal; and
a second input buffer means formed on said substrate for generating a second internal row address strobe signal in response to said external row address strobe signal; and
means for applying said second internal row address strobe signal to said test mode control means.

32. The semiconductor memory device according to claim 31, wherein said second input buffer means includes first inverting means for inverting said external address strobe signal and second inverting means inverting the output of said first inverting means.

33. The semiconductor memory device according to claim 32, wherein said second input buffer means further includes threshold voltage deviating means for deviating the threshold voltage of said second inverting means.

34. The semiconductor memory device according to claim 33, wherein said threshold voltage deviating means is provided between said first inverting means and said second inverting means and reduces a first threshold voltage corresponding to a switching of the output logical level of said second inverting means from said first logical level to said second logical level.

35. The semiconductor memory device according to claim 34, wherein said threshold voltage deviating means further increases a second threshold voltage corresponding to a switching of the output logical level of said second inverting means from said second logical level to said first logical level.

36. A semiconductor memory device comprising:
a memory cell array formed on a semiconductor substrate and comprising a plurality of memory cells arranged in rows and columns;
a plurality of word lines formed on said substrate and corresponding to said rows of memory cells;
a row decoder formed on said substrate for decoding an applied address signal corresponding to a selected word line;
a test mode control means formed on said substrate for generating a test mode signal for setting said device to test mode operation;
a first input buffer means formed on said substrate for applying a first bilevel internal address strobe signal to said row decoder in response to an external bilevel row address strobe signal; and
a second input buffer means formed on said substrate for generating a second bilevel internal row address strobe signal in response to said external row address strobe signal, said second bilevel internal row address strobe signal changing between a first level and a second level on a delayed basis in comparison with said first internal address strobe signal.

37. The semiconductor memory device according to claim 36, wherein said second input buffer means includes first inverting means for inverting said external address strobe signal and second inverting means inverting the output of said first inverting means.

38. The semiconductor memory device according to claim 37, wherein said second input buffer means further includes threshold voltage deviating means for deviating the threshold voltage of said second inverting means.

39. The semiconductor memory device according to claim 38, wherein said threshold voltage deviating means is provided between said first inverting means and said second inverting means and reduces a first threshold voltage corresponding to a switching of the output logical level of said second inverting means from said first logical level to said second logical level.

40. The semiconductor memory device according to claim 39, wherein said threshold voltage deviating means further increases a second threshold voltage corresponding to a switching of the output logical level of said second inverting means from said second logical level to said first logical level.

41. A semiconductor memory device comprising:
a memory cell array formed on a semiconductor substrate and comprising a plurality of memory cells arranged in rows and columns;
a plurality of word lines formed on said substrate and corresponding to said rows of memory cells;
a row decoder formed on said substrate for decoding an applied address signal corresponding to a selected word line;
a test mode control means formed on said substrate for generating a test mode signal for setting said device to test mode operation;

a first input buffer means formed on said substrate for applying a first bilevel internal address strobe signal to said row decoder in response to an external bilevel row address strobe signal; and a second input buffer means formed on said substrate for generating a second bilevel internal row address strobe signal in response to said external row address strobe signal, a threshold voltage required for changing from a low level to a high level in said second input buffer means being higher than a threshold voltage required for changing from a low level to a high level in said first input buffer.

42. A semiconductor memory device comprising:

a memory cell array formed on a semiconductor substrate and comprising a plurality of memory cells arranged in rows and columns;

a plurality of word lines formed on said substrate and corresponding to said rows of memory cells;

a row decoder formed on said substrate for decoding an applied address signal corresponding to a selected word line;

a test mode control means formed on said substrate for generating a test mode signal for setting said device to test mode operation;

a first input buffer means formed on said substrate for applying a first bilevel internal address strobe signal to said row decoder in response to an external bilevel row address strobe signal; and a second input buffer means formed on said substrate for generating a second bilevel internal row address strobe signal in response to said external row address strobe signal, said second input buffer means having a predetermined voltage difference between a threshold voltage required for changing said second bilevel internal row address strobe signal from a low level to a high level and a threshold voltage required for changing said second bilevel internal row address strobe signal from a high level to a low level.

43. A semiconductor memory device comprising:

a memory cell array, internal circuit means associated with data from said memory cell array and data writing to the same, reset pulse generating means responsive to a power supply for generating a reset pulse initializing said internal circuit means, said internal circuit means operating in response to first, second and third external control signals after said reset pulse is output from said reset pulse generating means, test mode designating signal generating means responsive to a change in the logical level of said third external control signal from a first logical level to a second logical level when said first and second external control signals are at a predetermined logical level for generating a test mode designating signal designating a test mode, first external control signal buffering means for buffering said first external control signal at all times without being controlled by said reset pulse and applying the same to said internal circuit means and said test mode designating signal generating means, second external control signal buffering means for buffering said second external control signal at all times without being controlled by said reset pulse and applying the same to said internal circuit means and said test mode designating signal generating means, first means for buffering said third external control signal for buffering said third external control signal only when said reset pulse is not generated from said reset pulse generating means and applying the same to said internal circuit means, and second means for buffering said third external control signal for buffering said third external control signal at all times without being controlled by said reset pulse and applying the same to said test mode designating signal generating means.

* * * * *